US010988841B2

(12) United States Patent
Washio et al.

(10) Patent No.: US 10,988,841 B2
(45) Date of Patent: Apr. 27, 2021

(54) FILM-FORMING METHOD, MANUFACTURING METHOD OF ELECTRONIC DEVICE, AND MASK HOLDER

(71) Applicant: THE JAPAN STEEL WORKS, LTD., Tokyo (JP)

(72) Inventors: Keisuke Washio, Kanagawa (JP); Masaki Chiba, Kanagawa (JP); Masao Nakata, Kanagawa (JP)

(73) Assignee: THE JAPAN STEEL WORKS, LTD., Tokyo (JP)

(*) Notice: Subject to any disclaimer, the term of this patent is extended or adjusted under 35 U.S.C. 154(b) by 0 days.

(21) Appl. No.: 16/490,530

(22) PCT Filed: Oct. 31, 2017

(86) PCT No.: PCT/JP2017/039430
§ 371 (c)(1),
(2) Date: Aug. 31, 2019

(87) PCT Pub. No.: WO2018/168057
PCT Pub. Date: Sep. 20, 2018

(65) Prior Publication Data
US 2020/0010949 A1 Jan. 9, 2020

(30) Foreign Application Priority Data

Mar. 17, 2017 (JP) .............................. JP2017-052836

(51) Int. Cl.
H01L 51/56 (2006.01)
C23C 16/04 (2006.01)
(Continued)

(52) U.S. Cl.
CPC ...... C23C 16/042 (2013.01); C23C 16/45525 (2013.01); H01L 51/5253 (2013.01); H01L 51/56 (2013.01)

(58) Field of Classification Search
CPC .......... H01J 37/32669; H01J 37/32743; H01J 37/32834; H01J 2237/332; C23C 16/042;
(Continued)

(56) References Cited

U.S. PATENT DOCUMENTS 5,164,974 A * 11/1992 Kariya ................ G03F 7/70358
250/491.1
5,608,773 A * 3/1997 Korenaga ............... G03F 7/707
378/208
(Continued)

FOREIGN PATENT DOCUMENTS

JP H03-177573 A 8/1991
JP 2005-339861 A 12/2005
(Continued)

OTHER PUBLICATIONS

International Search Report from International Patent Application No. PCT/JP2017/039430, dated Jan. 16, 2018.
(Continued)

Primary Examiner — Jarrett J Stark
(74) Attorney, Agent, or Firm — SGPatents PLLC

(57) ABSTRACT

In order to suppress a film from being formed in a gap between a mask and a substrate, a technology of improving adhesion between the mask and the substrate is provided. A film-forming method includes the step of suspending a mask MK by a suspension portion HU in a state in which the suspension portion HU is supported by a supporting portion SU and the step of bringing the mask MK suspended by the suspension portion HU into contact with a glass substrate
(Continued)

Figure 1:
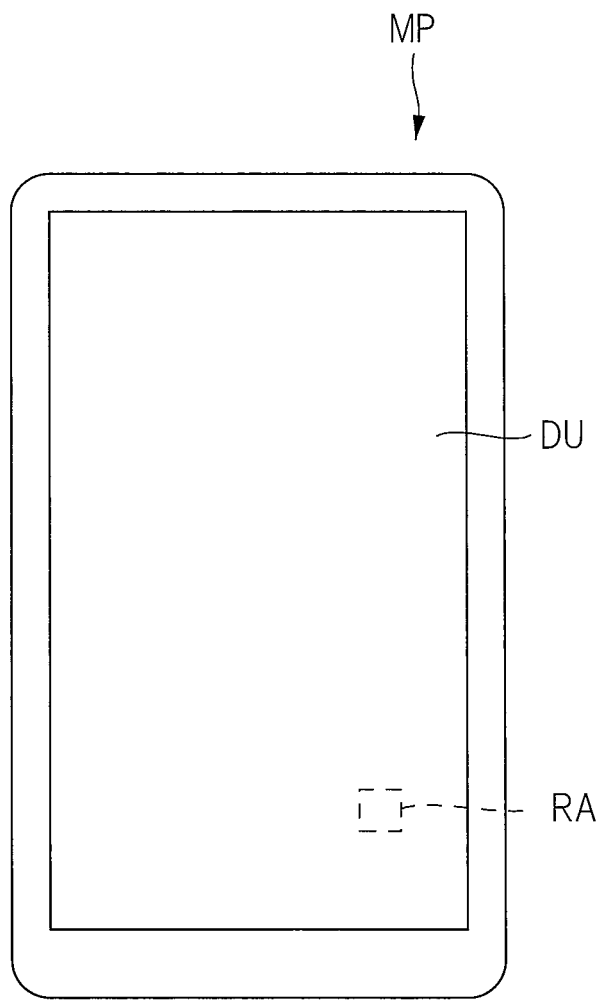

GS in the state in which the suspension portion HU is supported by the supporting portion SU.

3 Claims, 21 Drawing Sheets

(51) Int. Cl.
  *C23C 16/455* (2006.01)
  *H01L 51/52* (2006.01)
(58) Field of Classification Search
  CPC ............ C23C 16/45542; C23C 16/403; C23C 16/45544; H01L 51/5253; H01L 51/56; H01L 21/31; H01L 21/02642; H05B 33/04; H05B 33/10
  See application file for complete search history.

(56) References Cited

U.S. PATENT DOCUMENTS

| | | | | |
|---|---|---|---|---|
| 6,703,179 | B2* | 3/2004 | Tyan | C23C 14/048 |
| | | | | 156/234 |
| 7,097,750 | B2* | 8/2006 | Kang | C23C 14/042 |
| | | | | 118/504 |
| 2002/0187265 | A1* | 12/2002 | Mori | C23C 14/022 |
| | | | | 427/282 |
| 2006/0197935 | A1* | 9/2006 | Edo | G03F 7/70741 |
| | | | | 355/75 |
| 2007/0184195 | A1* | 8/2007 | Hatakeyama | C23C 14/042 |
| | | | | 427/282 |
| 2008/0118645 | A1* | 5/2008 | Colburn | B82Y 10/00 |
| | | | | 427/299 |
| 2008/0233272 | A1* | 9/2008 | Ibe | C23C 14/26 |
| | | | | 427/66 |
| 2009/0291610 | A1 | 11/2009 | Sasaki | |
| 2011/0048323 | A1* | 3/2011 | Kondo | C23C 14/042 |
| | | | | 118/500 |
| 2012/0028454 | A1* | 2/2012 | Swaminathan | C23C 16/345 |
| | | | | 438/558 |
| 2013/0122197 | A1* | 5/2013 | Lee | C23C 16/042 |
| | | | | 427/248.1 |
| 2014/0206128 | A1* | 7/2014 | Nakatani | H01L 27/14687 |
| | | | | 438/66 |
| 2015/0228859 | A1* | 8/2015 | Morreale | H01L 29/1606 |
| | | | | 257/29 |
| 2016/0122871 | A1* | 5/2016 | Lee | H01L 29/40117 |
| | | | | 156/345.24 |
| 2016/0372715 | A1* | 12/2016 | Seo | C23C 16/455 |
| 2018/0269128 | A1* | 9/2018 | Limaye | H01L 23/3672 |
| 2020/0010949 | A1* | 1/2020 | Washio | H01L 51/0011 |
| 2020/0277701 | A1* | 9/2020 | Otsuka | C23C 16/4412 |

FOREIGN PATENT DOCUMENTS

| | | |
|---|---|---|
| JP | 2006-045583 A | 2/2006 |
| JP | 2013-187019 A | 9/2013 |
| JP | 2014-532304 A | 12/2014 |
| JP | 2015-199607 A | 11/2015 |
| JP | 2016-225325 A | 12/2016 |
| WO | WO 2009/069743 A1 | 6/2009 |

OTHER PUBLICATIONS

Office Action dated Oct. 13, 2020, in Japanese Patent Application No. 2017-052836.

* cited by examiner

FIG. 6
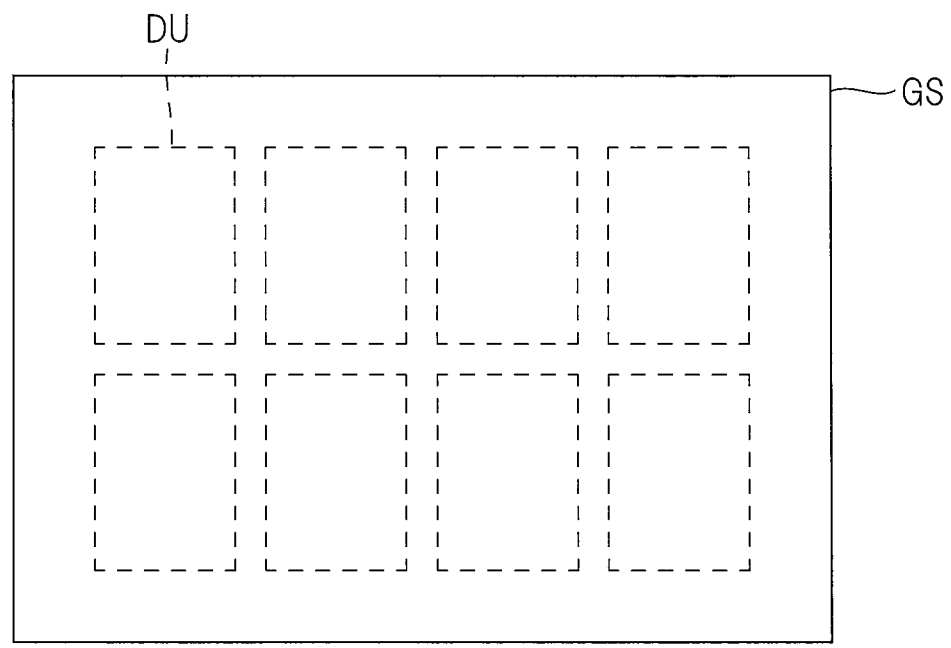
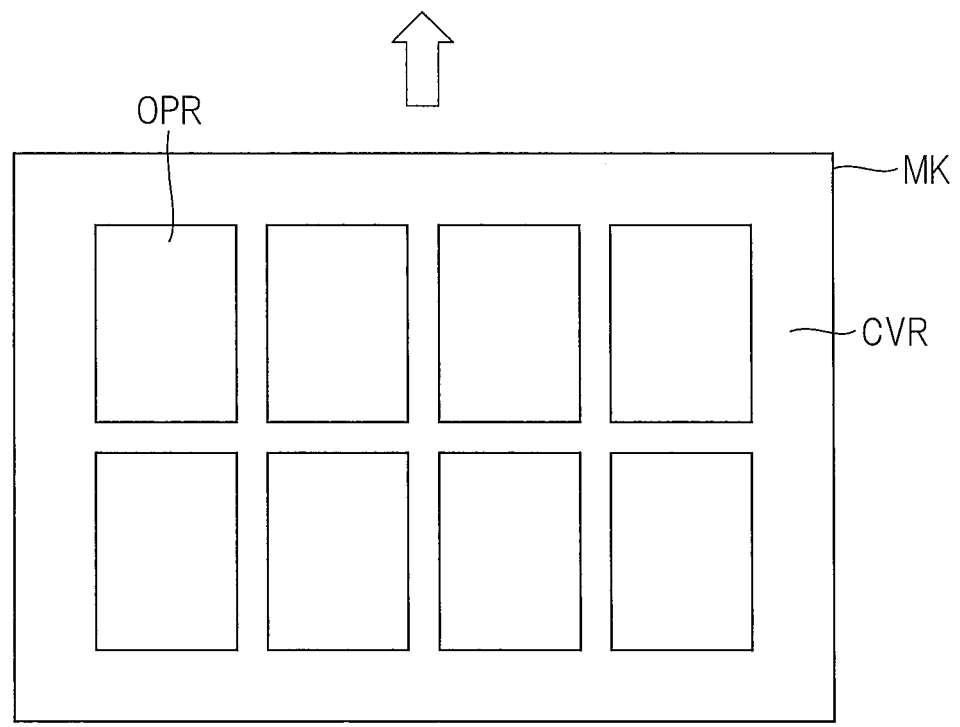

FIG. 7
CVD METHOD
(a)
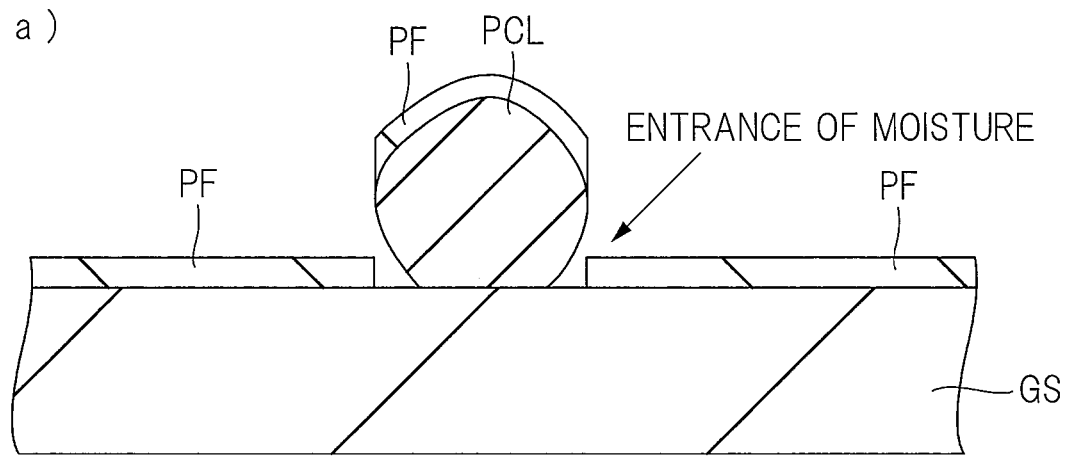
ENTRANCE OF MOISTURE
↓ THICKENING
(b)
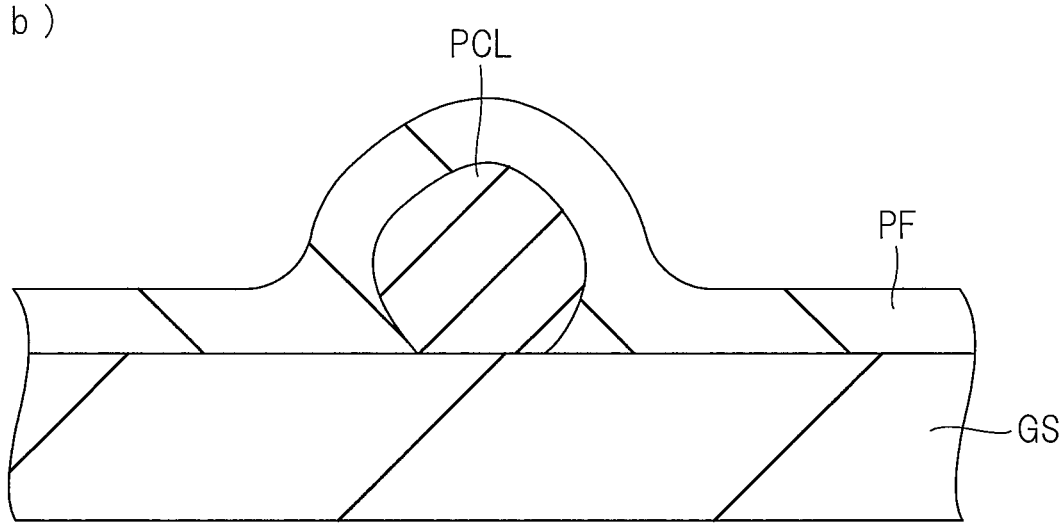

ALD METHOD

FIG. 16
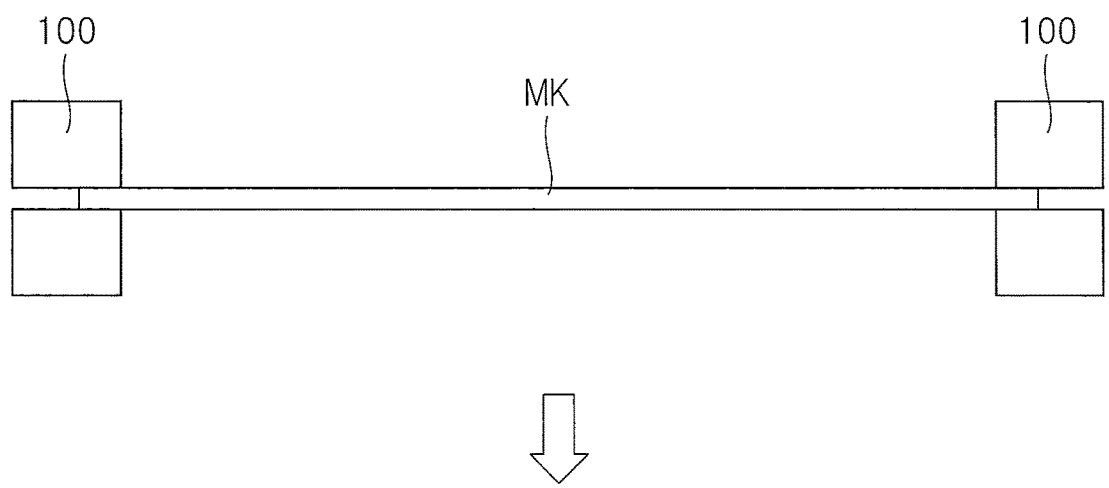
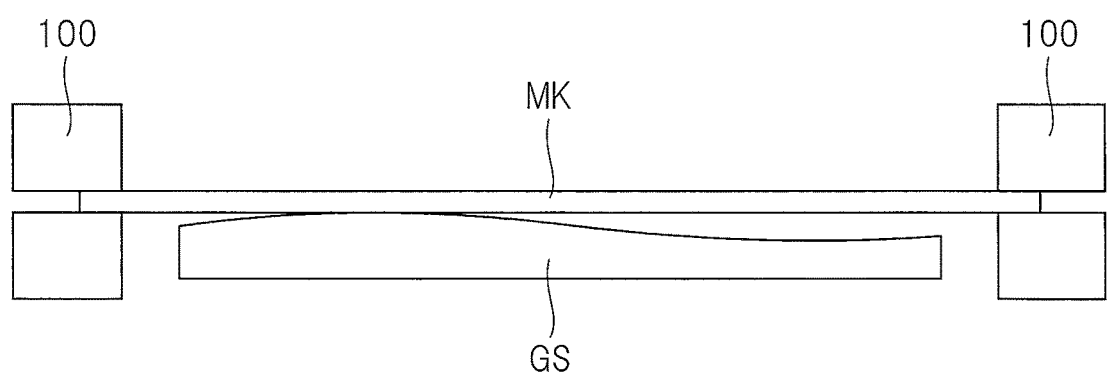

FILM-FORMING METHOD, MANUFACTURING METHOD OF ELECTRONIC DEVICE, AND MASK HOLDER

TECHNICAL FIELD

The present invention relates to a film-forming technology, a manufacturing technology of an electronic device, and a mask holder, and relates to, for example, a technology effectively applied when forming a protection film that protects an organic EL (Electro-Luminescence) film.

BACKGROUND ART

Japanese Patent Application Laid-Open Publication No. 2005-339861 (Patent Document 1) describes a technology relating to a mask structure fixed to a support frame in a state of applying a tensile force to a metal mask.

Japanese Patent Application Laid-Open Publication No. 2013-187019 (Patent Document 2) describes a technology relating to a protection film that covers a surface of an organic EL element.

RELATED ART DOCUMENTS

Patent Documents

Patent Document 1: Japanese Patent Application Laid-Open Publication No. 2005-339861
Patent Document 2: Japanese Patent Application Laid-Open Publication No. 2013-187019

SUMMARY OF THE INVENTION

Problems to be Solved by the Invention

For example, for suppressing a film from being formed in a gap between a mask and a substrate, a technology of improving an adhesion between the mask and the substrate has been desired.

The other problems and novel characteristics will be apparent from the description of this specification and the accompanying drawings.

Means for Solving the Problems

A film-forming method according to an embodiment includes the steps of: suspending a mask by a suspension portion in a state where the suspension portion is supported by a supporting portion; and bringing the mask suspended by the suspension portion into contact with a substrate in a state where the suspension portion is supported by the supporting portion.

Effects of the Invention

By the film-forming technology according to the embodiment, it is possible to improve the film-forming characteristics.

BRIEF DESCRIPTIONS OF THE DRAWINGS

Figure 2:
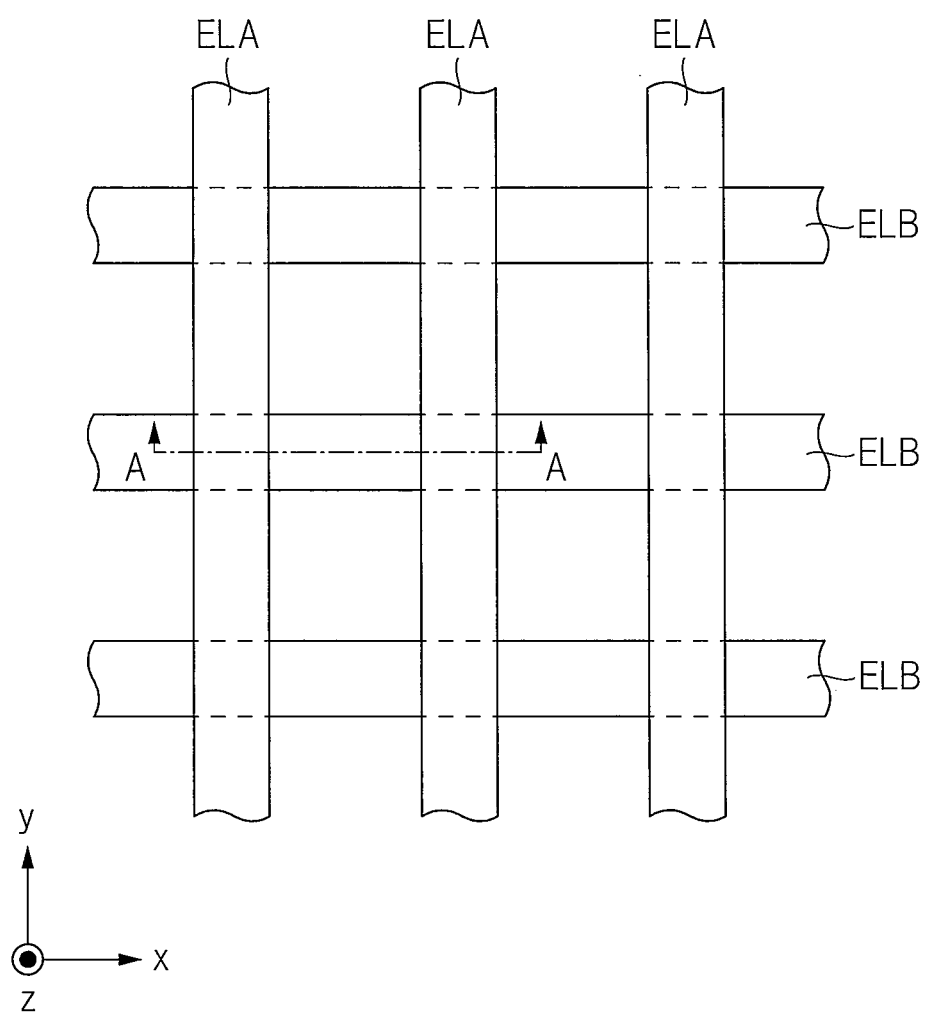
Figure 3:
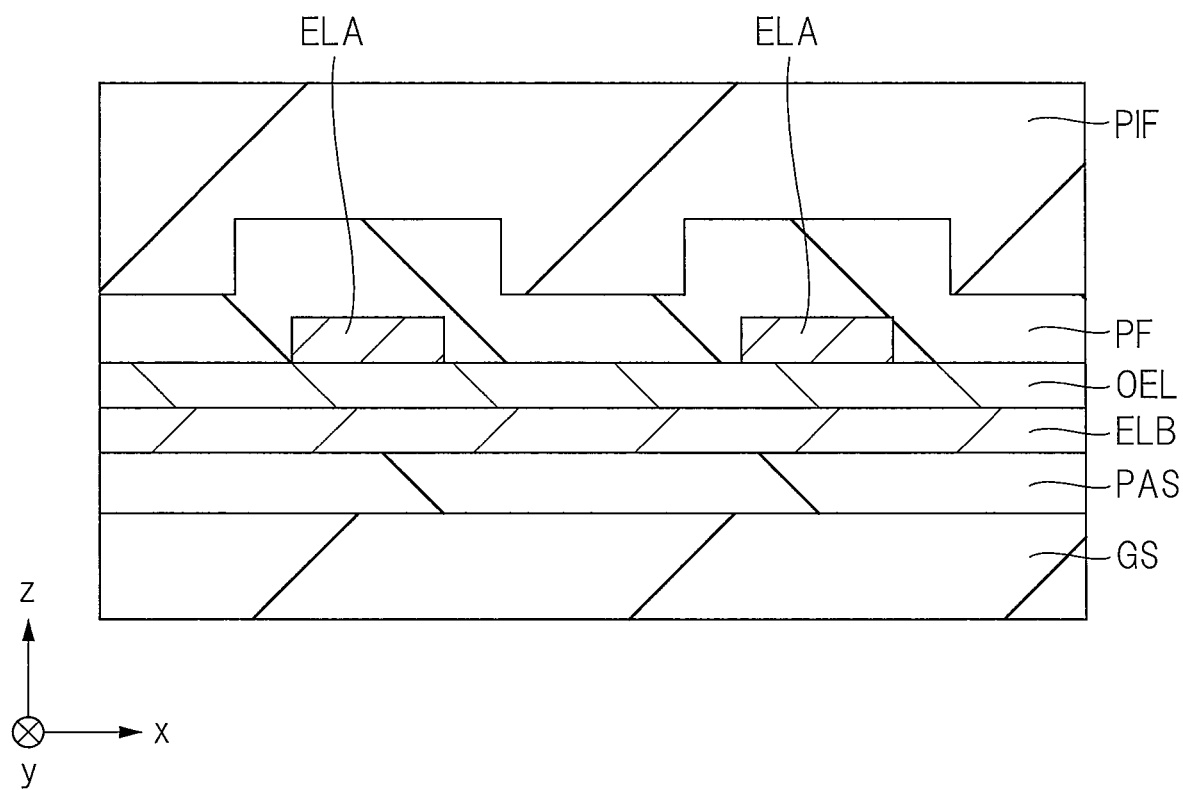
Figure 4:
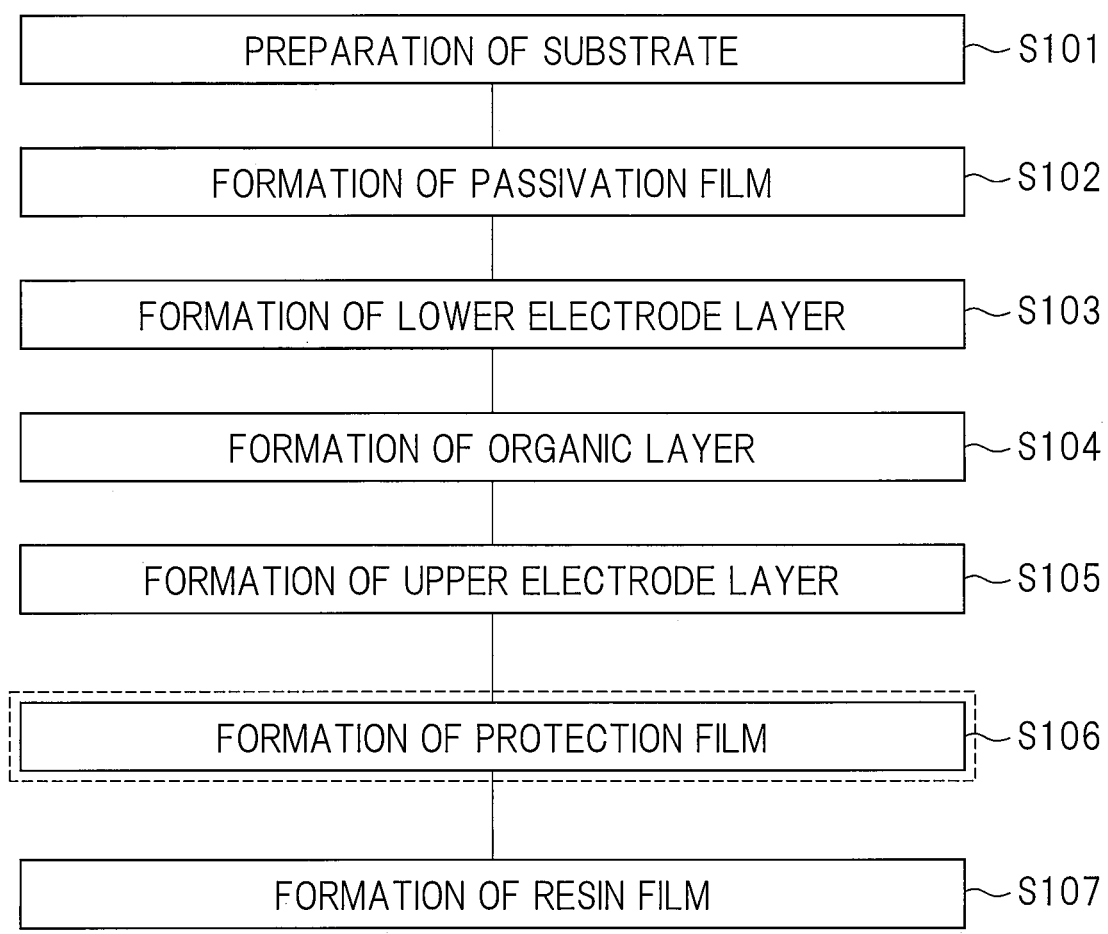
Figure 5:
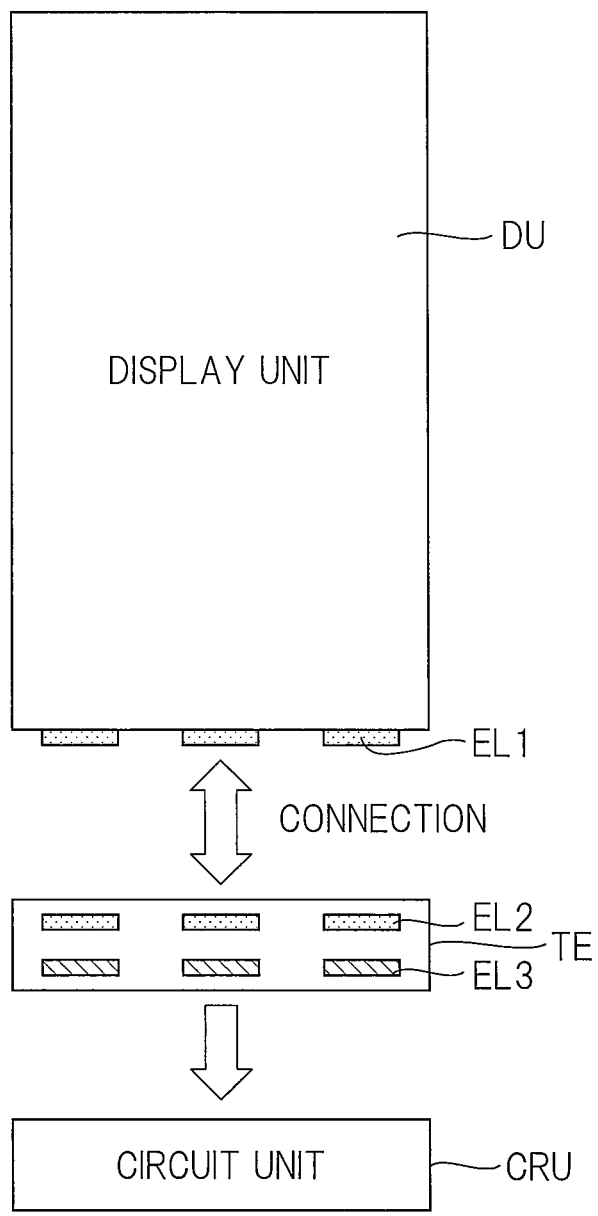
Figure 8:
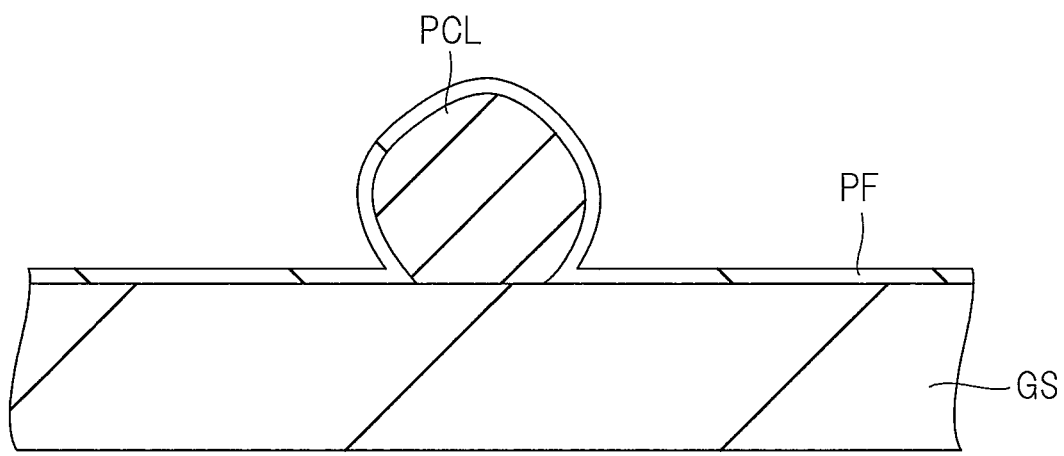
Figure 9:
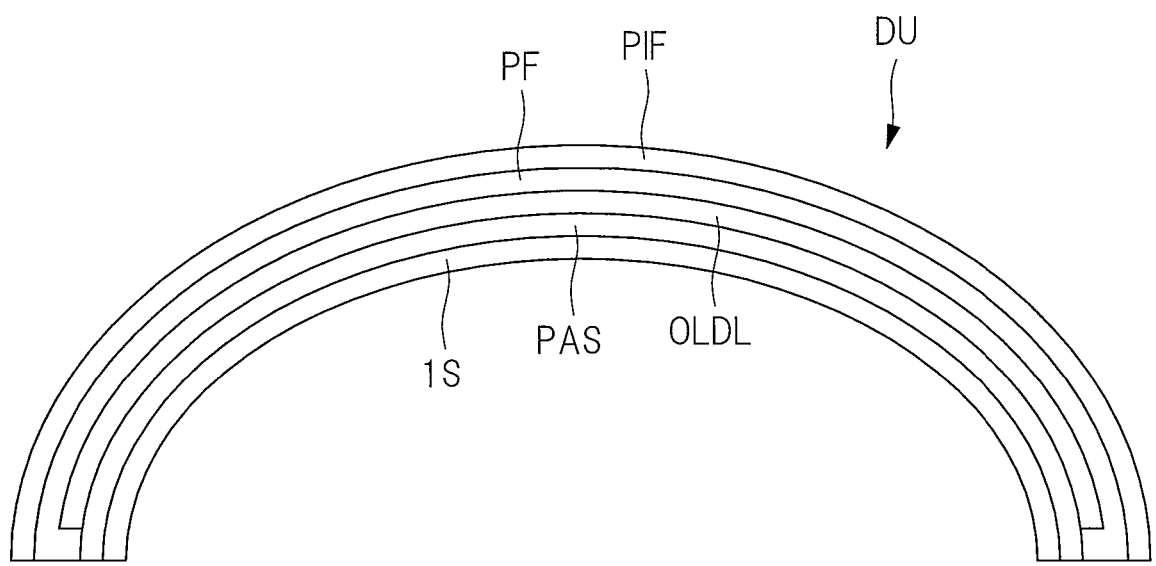
Figure 10:
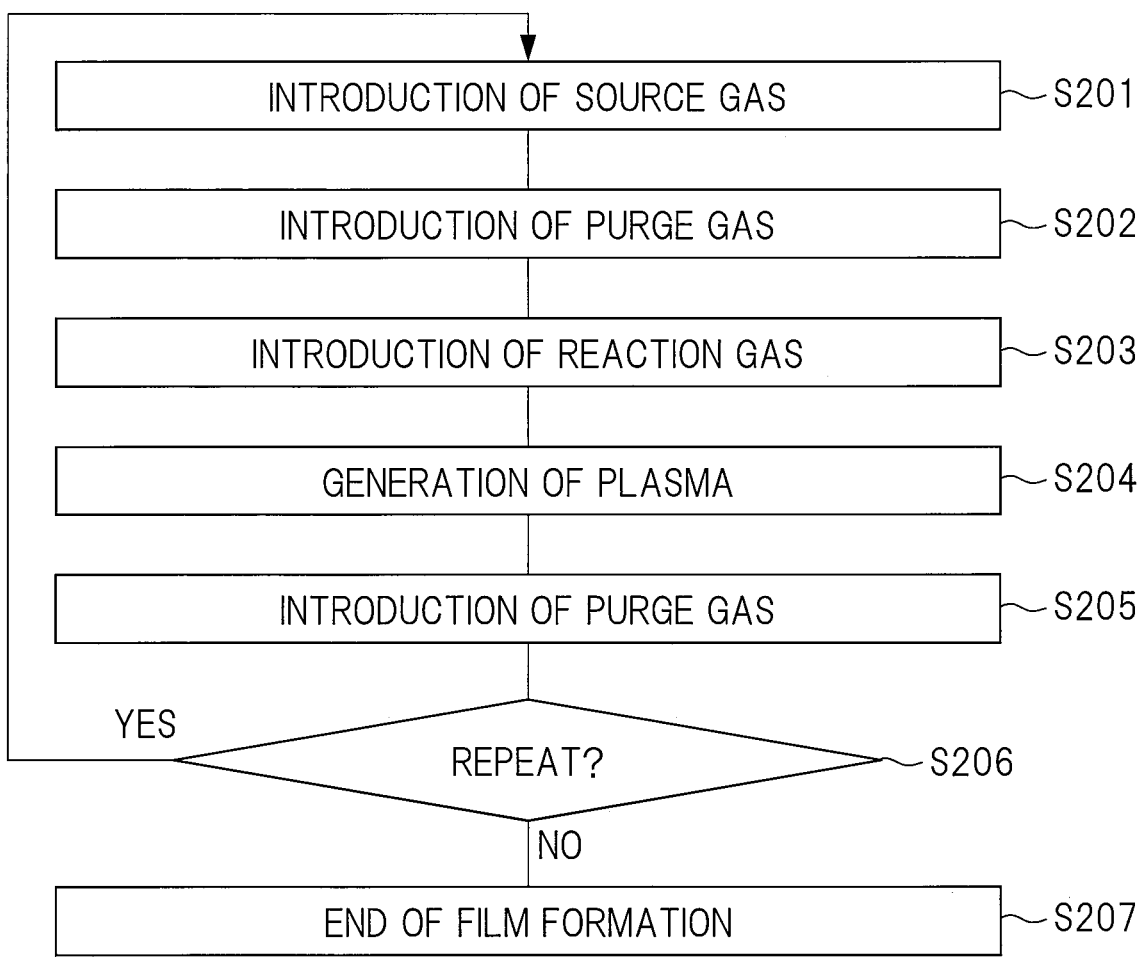
Figure 11:
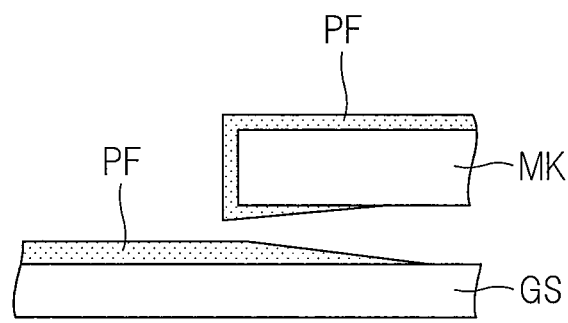
Figure 12:
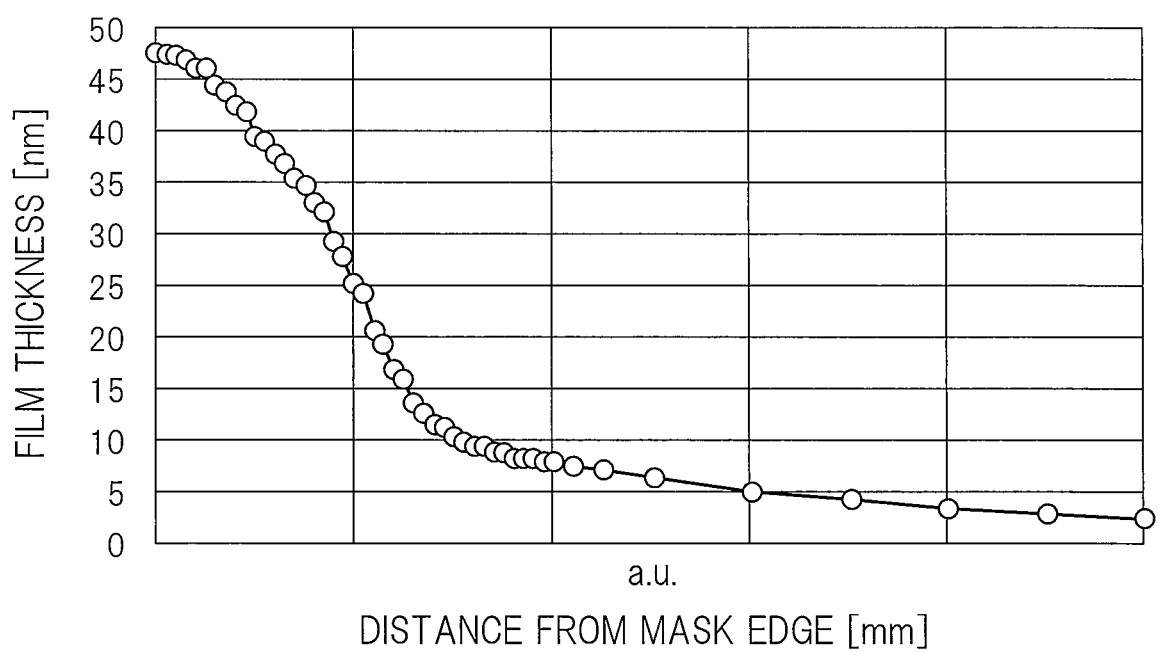
Figure 13:
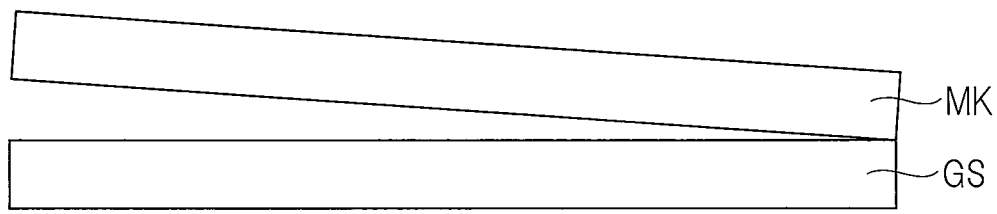
Figure 14:
Figure 15:
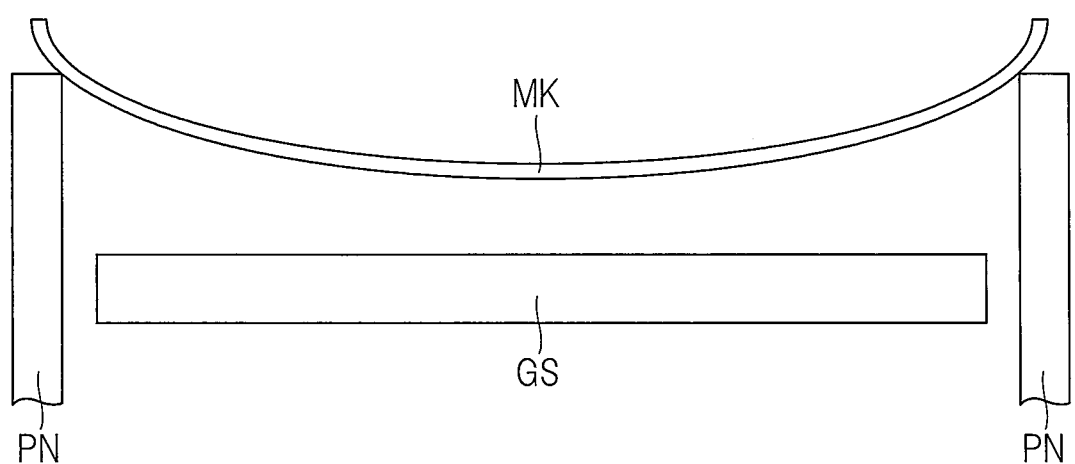
Figure 17:
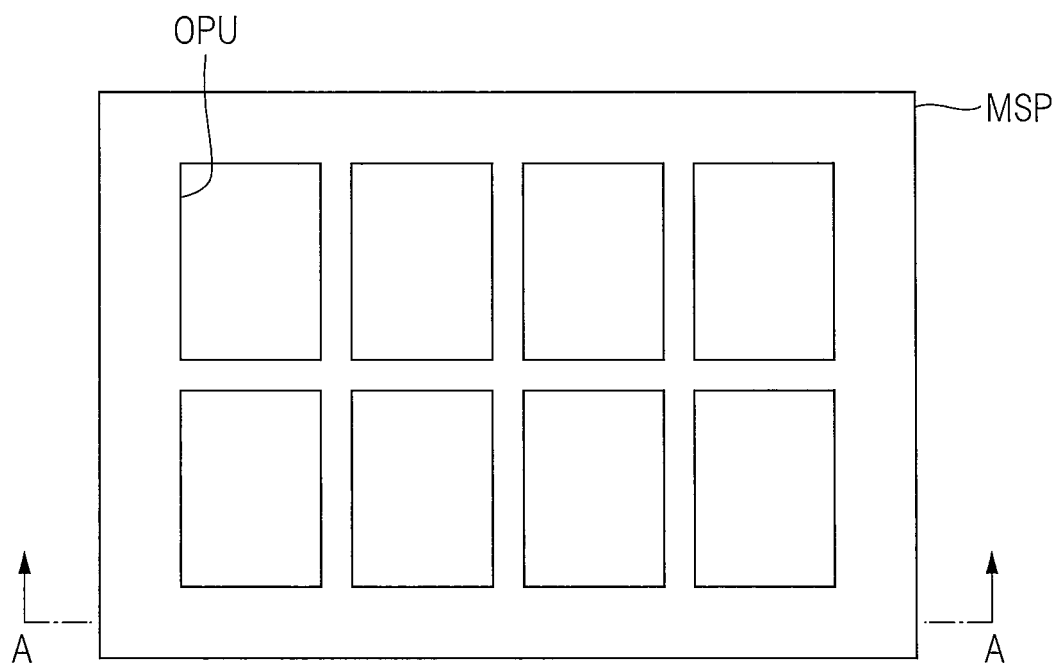
Figure 18:
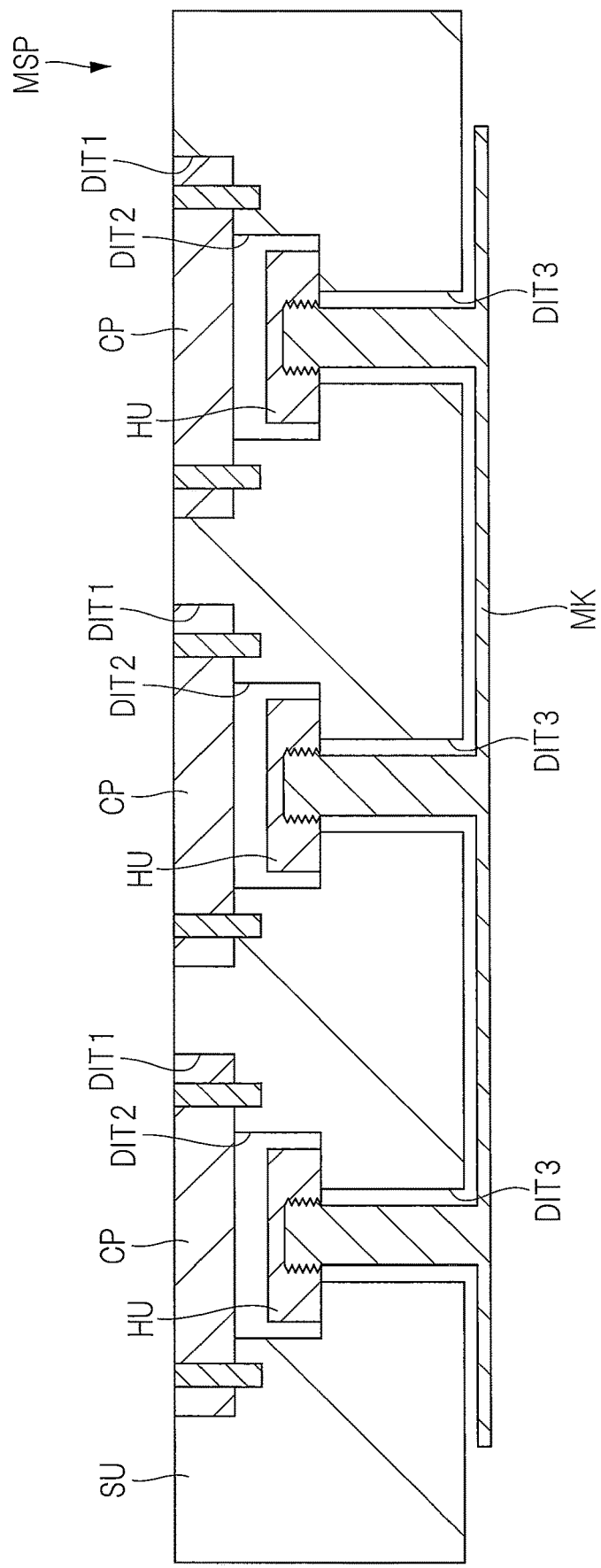
Figure 19:
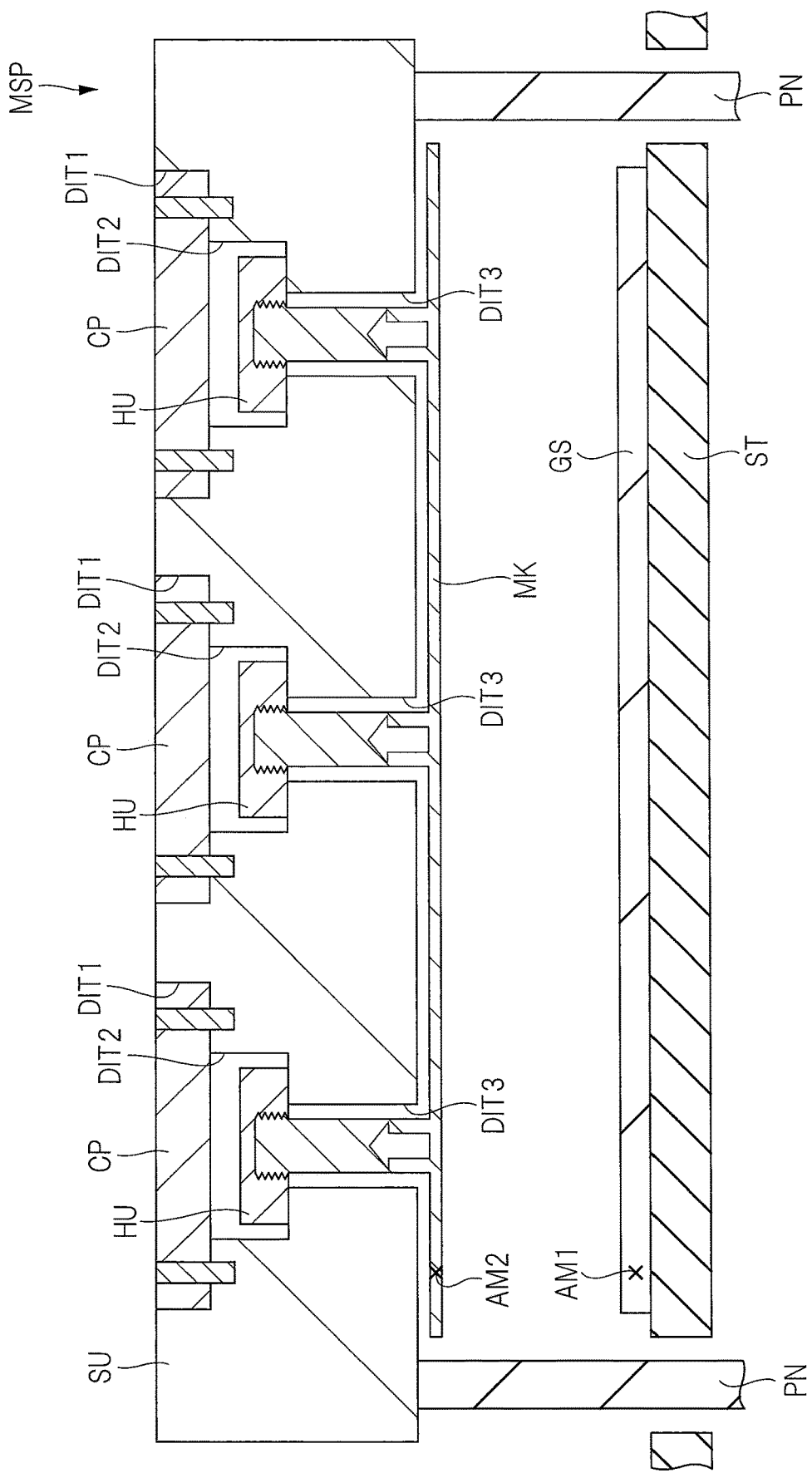
Figure 20:
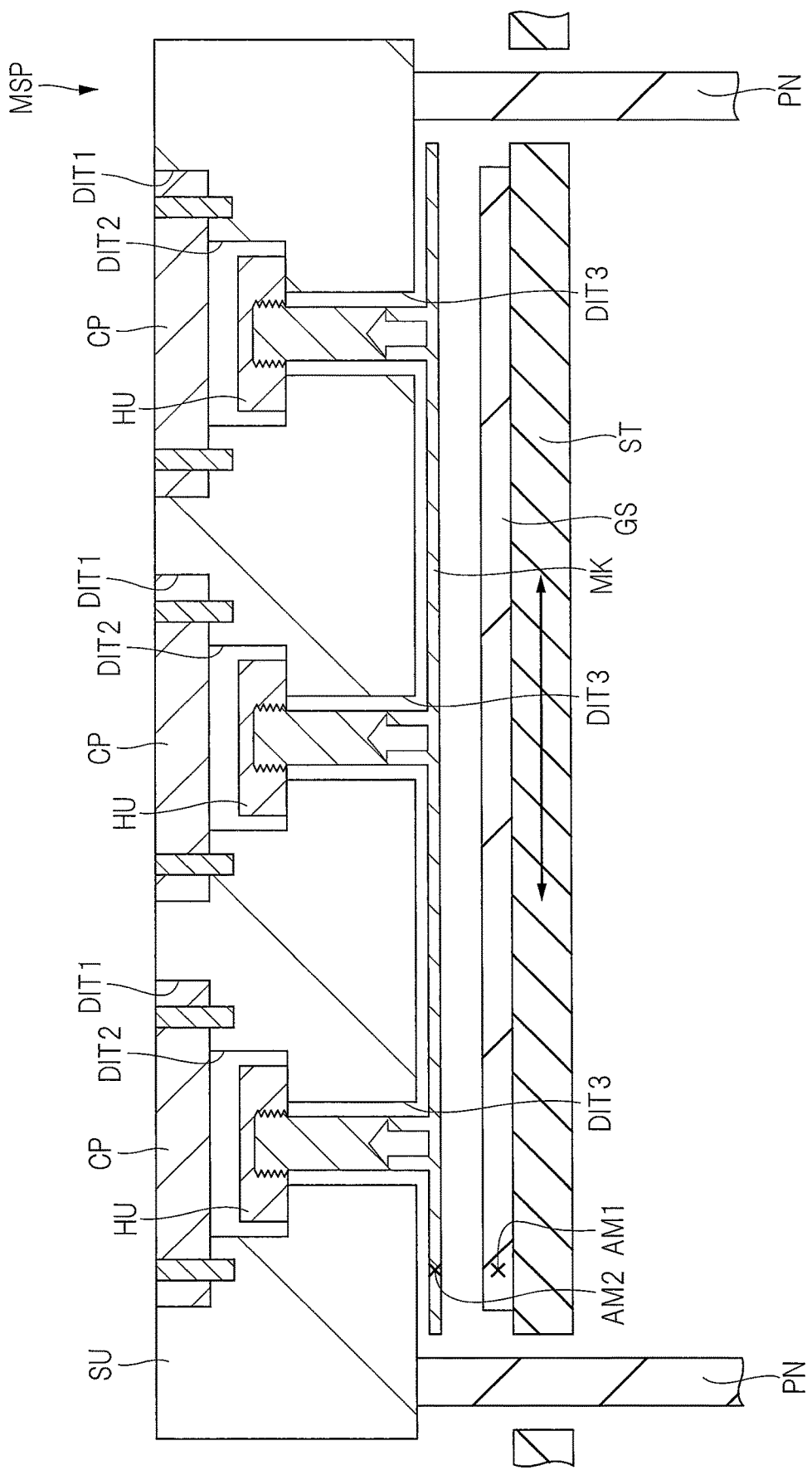
Figure 21:
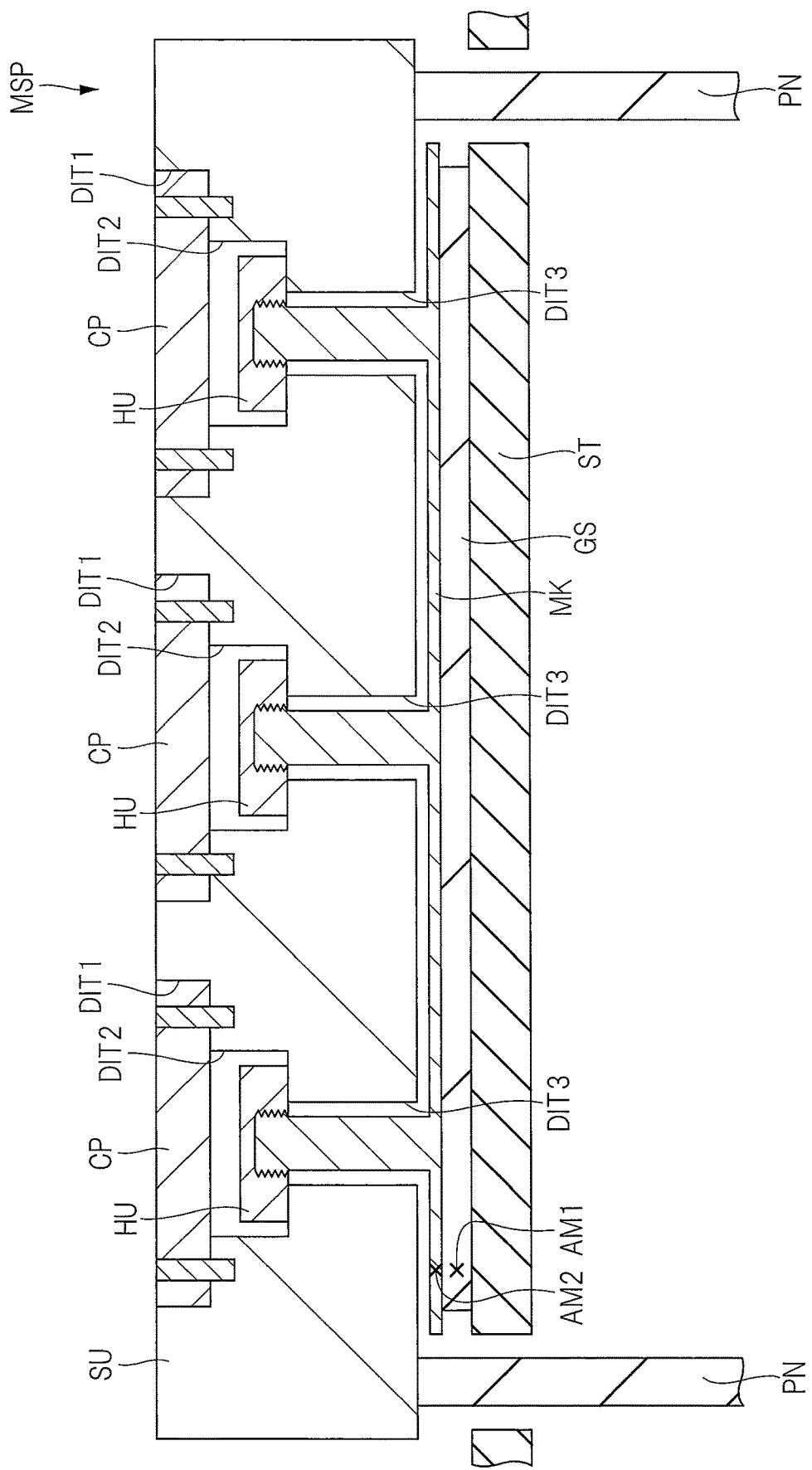
Figure 22:
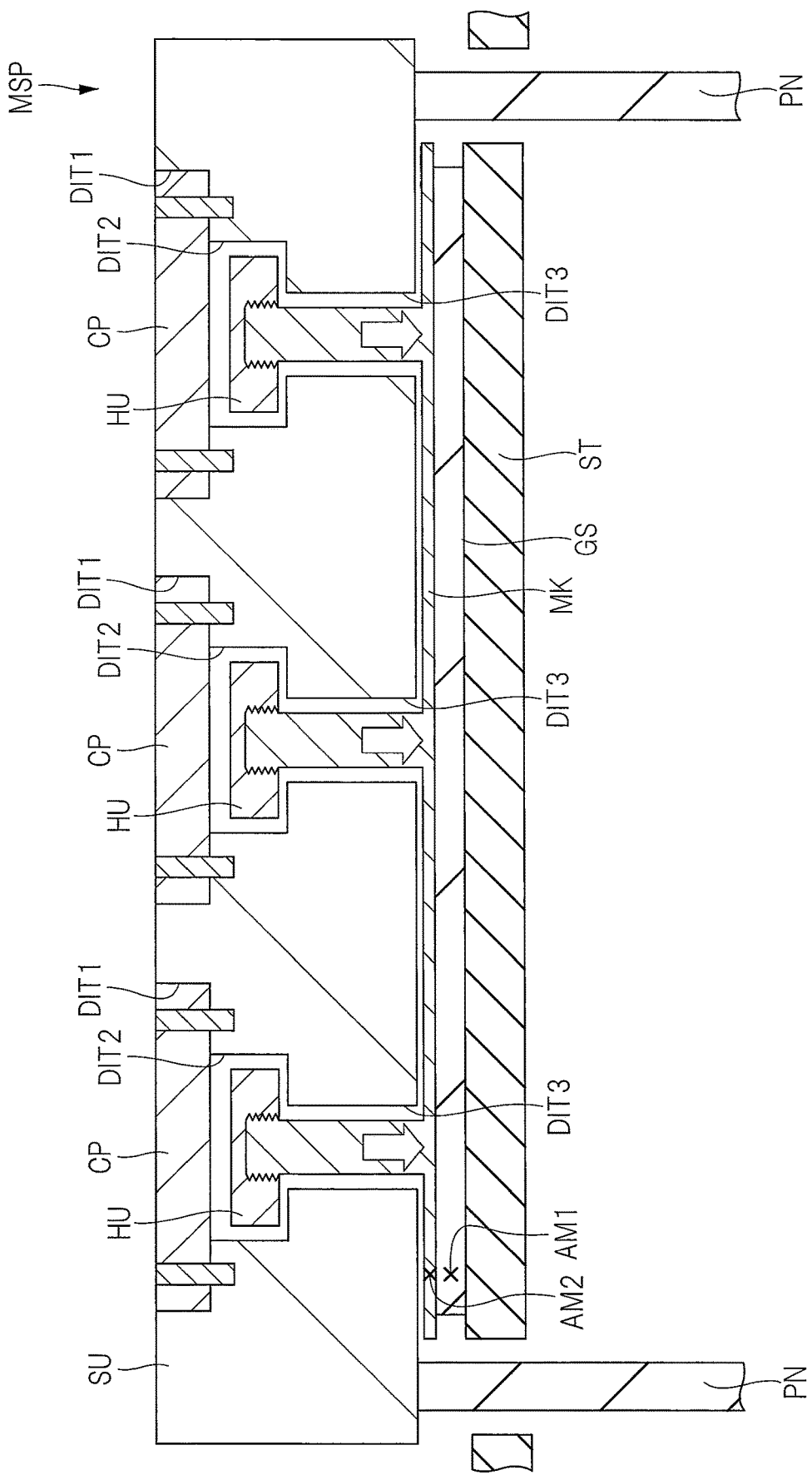
Figure 23:
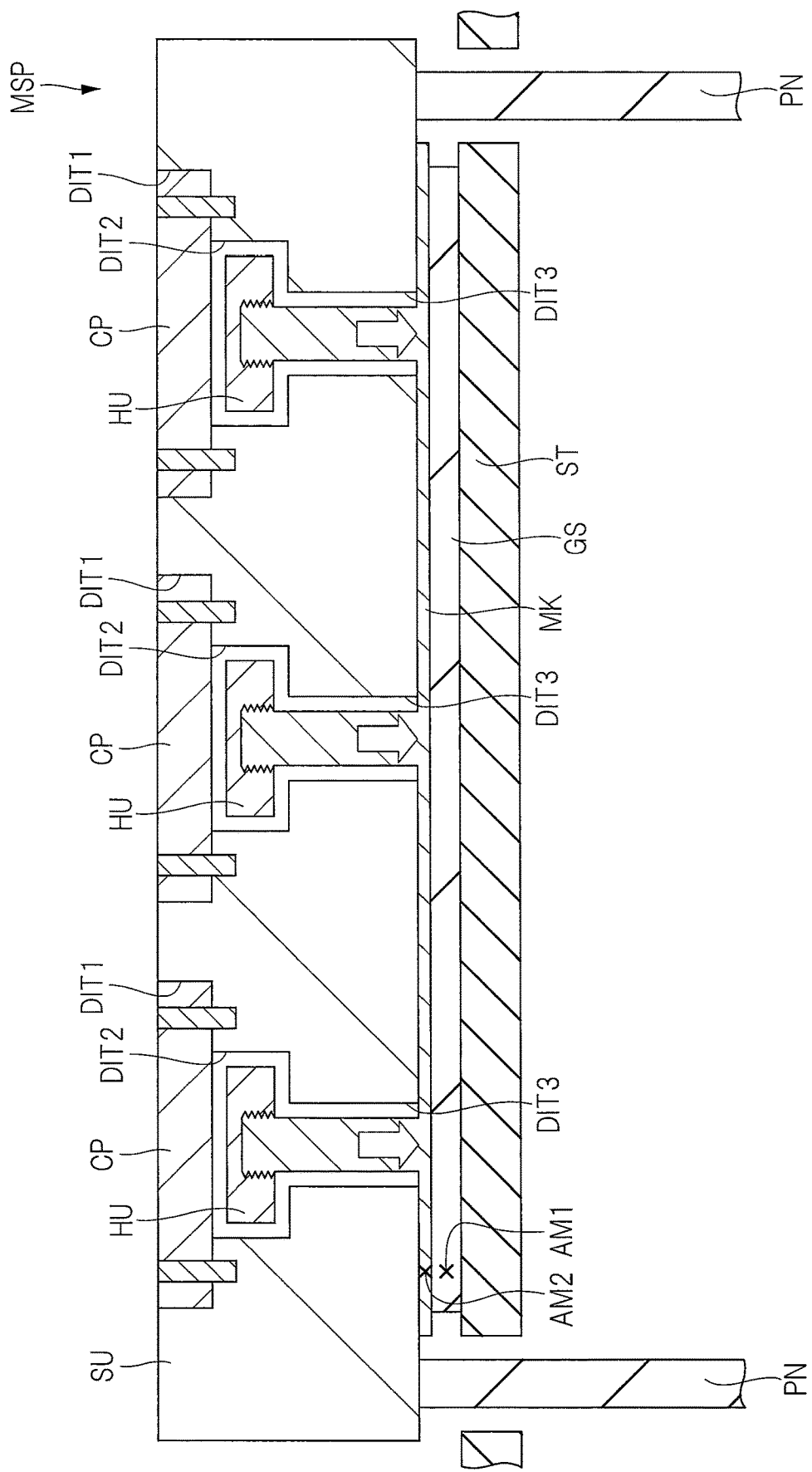
Figure 24:
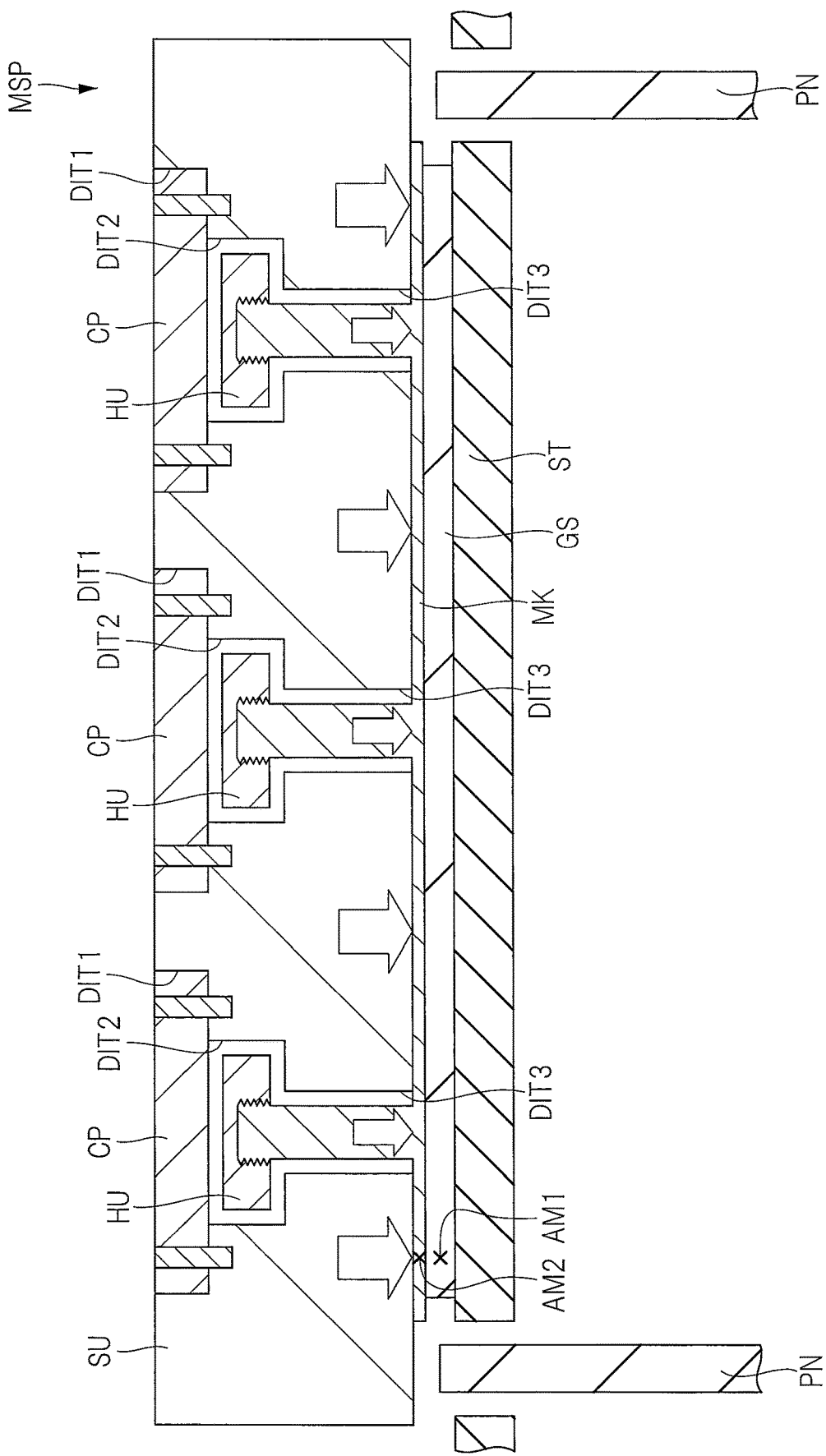

FIG. 1 is a plan view showing a mobile phone (smartphone) seen from a front side;
FIG. 2 is a diagram showing a layout configuration formed in a partial region of a display unit;
FIG. 3 is a cross-sectional view taken along a line A-A of FIG. 2;
FIG. 4 is a flowchart showing a manufacturing process of the display unit;
FIG. 5 is a diagram schematically showing a configuration example of electrically connecting the display unit and a circuit unit;
FIG. 6 is a diagram showing a state in which a mask is disposed over a glass substrate;
FIG. 7(*a*) is a cross-sectional view showing a state of forming a thin protection film over a glass substrate having a foreign particle adhered thereto by the CVD method, and FIG. 7(*b*) is a cross-sectional view showing a state of forming a thick protection film over a glass substrate having a foreign particle adhered thereto by the CVD method;
FIG. 8 is a cross-sectional view showing a state of forming a thin protection film over a glass substrate having a foreign particle adhered thereto by the ALD method;
FIG. 9 is a diagram schematically showing a state in which a flexible substrate is used as a substrate of the display unit and this flexible substrate is bent;
FIG. 10 is a flowchart for describing a forming method of a protection film by the plasma atomic layer deposition method;
FIG. 11 is a diagram schematically showing a state in which a protection film is formed so as to enter a minute gap between a glass substrate and a mask;
FIG. 12 is a graph showing a relationship between a distance of entrance from a mask edge toward the mask and a thickness of the formed protection film in a related technology;
FIG. 13 is a diagram illustrating that a minute gap is formed between a mask and a glass substrate when the mask is thick;
FIG. 14 is a diagram illustrating that a minute gap is less likely to be formed between a mask and a glass substrate when the mask is thin;
FIG. 15 is a diagram illustrating that it is difficult to hold a mask by pins when the mask is thin;
FIG. 16(*a*) is a diagram illustrating a method of fixing both ends of a thin mask by holding members while applying a tension to the mask, and FIG. 16(*b*) is a diagram illustrating that the thin mask to which a tension is applied does not fit the unevenness of a glass substrate;
FIG. 17 is a plan view showing a planar configuration of a mask holder according to an embodiment;
FIG. 18 is a cross-sectional view schematically showing a cross-sectional configuration of the mask holder taken along a line A-A of FIG. 17;
FIG. 19 is a diagram illustrating an operation of disposing a mask over a glass substrate;
FIG. 20 is a diagram illustrating the operation continued from FIG. 19;
FIG. 21 is a diagram illustrating the operation continued from FIG. 20;
FIG. 22 is a diagram illustrating the operation continued from FIG. 21;
FIG. 23 is a diagram illustrating the operation continued from FIG. 22; and
FIG. 24 is a diagram illustrating the operation continued from FIG. 23.

DETAILED DESCRIPTION OF PREFERRED EMBODIMENTS

The same components are denoted by the same reference characters throughout the drawings for describing the embodiments, and the repetitive description thereof will be omitted. Note that hatching may be applied in some cases even in a plan view for easy understanding.

Configuration of Display Unit of Mobile Phone

FIG. 1 is a plan view showing a mobile phone (smartphone) MP seen from a front side. As shown in FIG. 1, the mobile phone MP according to this embodiment has a substantially rectangular shape and a display unit DU for displaying an image is provided on a front side of the mobile phone MP. For example, the display unit DU according to this embodiment is an organic EL display unit (organic Electro-Luminescence display unit) using an organic EL element. Also, though not shown, the mobile phone MP includes a circuit unit for driving the display unit DU.

In the display unit DU, a plurality of pixels are arranged in an array, which makes it possible to display an image. Various circuits are formed as appropriate in the circuit unit. For example, the circuit unit is configured to include a driving circuit electrically connected to each of the plurality of pixels constituting the display unit DU, and the driving circuit is configured to be able to display an image on the display unit DU by controlling the plurality of pixels constituting the display unit DU.

Next, FIG. 2 is a plan view schematically showing a layout configuration formed in a region RA which is a partial region of the display unit DU. As shown in FIG. 2, in the region RA, for example, lower electrode layers ELB each extending in an x direction are arranged in a y direction so as to be separated from each other, and upper electrode layers ELA each extending in the y direction are arranged in the x direction so as to be separated from each other. Therefore, in the region RA, the lower electrode layers ELB and the upper electrode layers ELA are laid out so as to intersect with each other.

Next, FIG. 3 is a cross-sectional view taken along a line A-A of FIG. 2. As shown in FIG. 3, for example, a passivation film PAS is formed over a glass substrate GS having translucency to visible light. The passivation film PAS is made of an insulating material (insulating film), for example, a silicon oxide film. Although the passivation film PAS may not be formed over the glass substrate GS in some cases, it is more desirable to form the passivation film PAS. The passivation film PAS can be formed over almost entire upper surface of the glass substrate GS.

The passivation film PAS has a function of preventing moisture from entering the organic EL element (in particular, organic layer OEL) from a side of the glass substrate GS. Therefore, the passivation film PAS functions as a protection film on a lower side of the organic EL element. On the other hand, a protection film PF functions as a protection film on an upper side of the organic EL element, and has a function of preventing moisture from entering the organic EL element (in particular, organic layer OEL) from an upper side.

The organic EL element is formed over the upper surface of the glass substrate GS with the passivation film PAS interposed therebetween. The organic EL element is made up of the lower electrode layer ELB, the organic layer OEL, and the upper electrode layer ELA. Namely, over the passivation film PAS over the glass substrate GS, the lower electrode layer ELB, the organic layer OEL, and the upper electrode layer ELA are stacked in this order from below, and the organic EL element is composed of the lower electrode layer ELB, the organic layer OEL, and the upper electrode layer ELA.

The lower electrode layer ELB constitutes one of an anode and a cathode, and the upper electrode layer ELA constitutes the other of the anode and the cathode. Namely, when the lower electrode layer ELB is an anode (anode layer), the upper electrode layer ELA is a cathode (cathode layer), and when the lower electrode layer ELB is a cathode (cathode layer), the upper electrode layer ELA is an anode (anode layer). Each of the lower electrode layer ELB and the upper electrode layer ELA is made of a conductive film.

One of the lower electrode layer ELB and the upper electrode layer ELA is desirably composed of a metal film such as an aluminum film (Al film) so as to be able to function as a reflection electrode. Also, the other of the lower electrode layer ELB and the upper electrode layer ELA is desirably composed of a transparent conductor film made of ITO (indium tin oxide) or the like so as to be able to function as a transparent electrode. When the so-called bottom emission type in which light is emitted from a lower surface side of the glass substrate GS is adopted, the lower electrode layer ELB can be formed as the transparent electrode. On the other hand, when the so-called top emission type in which light is emitted from an upper surface side of the glass substrate GS is adopted, the upper electrode layer ELA can be formed as the transparent electrode. In addition, when the bottom emission type is adopted, a transparent substrate having translucency to visible light can be used as the glass substrate GS.

Since the lower electrode layer ELB is formed over the passivation film PAS over the glass substrate GS, the organic layer OEL is formed over the lower electrode layer ELB, and the upper electrode layer ELA is formed over the organic layer OEL, the organic layer OEL is interposed between the lower electrode layer ELB and the upper electrode layer ELA.

The organic layer OEL includes at least an organic light emission layer. The organic layer OEL can further include any of a hole transport layer, a hole implantation layer, an electron transport layer, and an electron implantation layer as needed in addition to the organic light emission layer. Therefore, for example, the organic layer OEL is configured to have a single layer structure of an organic light emission layer, a stacked layer structure including a hole transport layer, an organic light emission layer, and an electron transport layer, or a stacked layer structure including a hole implantation layer, a hole transport layer, an organic light emission layer, an electron transport layer, and an electron implantation layer.

For example, as shown in FIG. 2, the lower electrode layers ELB form a stripe-shaped pattern extending in the x direction. Namely, a plurality of the lower electrode layers ELB are arranged in the y direction at predetermined intervals while extending in the x direction. On the other hand, the upper electrode layers ELA form a stripe-shaped pattern extending in the y direction. Namely, a plurality of the upper electrode layers ELA are arranged in the x direction at predetermined intervals while extending in the y direction. In other words, the lower electrode layers ELB are made up of a stripe-shaped electrode group extending in the x direction, and the upper electrode layers ELA are made up of a stripe-shaped electrode group extending in the y direction. Here, the x direction and the y direction are directions intersecting with each other, more specifically, directions orthogonal to each other. Also, the x direction and the y direction are directions substantially parallel to the upper surface of the glass substrate GS.

Since the extending direction of the lower electrode layer ELB is the x direction and the extending direction of the upper electrode layer ELA is the y direction, the lower electrode layer ELB and the upper electrode layer ELA intersect with each other in plan view. Note that "in plan view" means the case of being seen on a plane substantially parallel to the upper surface of the glass substrate GS.

At each intersection portion between the lower electrode layer ELB and the upper electrode layer ELA, the organic layer OEL is sandwiched by the lower electrode layer ELB and the upper electrode layer ELA disposed one above the other. Accordingly, at each intersection portion between the lower electrode layer ELB and the upper electrode layer ELA, the organic EL element made up of the lower electrode ELB, the upper electrode ELA, and the organic layer OEL is formed, and the organic EL element forms the pixel. By applying a predetermined voltage between the lower electrode ELB and the upper electrode ELA, the organic light emission layer in the organic layer OEL sandwiched between the lower electrode ELB and the upper electrode ELA emits light.

Note that the organic layer OEL may be formed over the entire display unit DU, and may be formed to have the same pattern as the lower electrode layer ELB. Similarly, the organic layer OEL may be formed to have the same pattern as the upper electrode layer ELA. In any case, the organic layer OEL is present at each intersection portion between the lower electrode layer ELB and the upper electrode layer ELA.

As described above, in the display unit DU, the organic EL elements constituting the pixels are arranged in an array over the glass substrate GS in plan view.

Note that the case in which the lower electrode layers ELB and the upper electrode layers ELA are configured of stripe-shaped patterns is described here. Therefore, in the plurality of organic EL elements (pixels) arranged in an array, the organic EL elements arranged in the x direction have the common lower electrode layer ELB. Meanwhile, the organic EL elements arranged in the y direction have the common upper electrode layer ELA. However, the structure of the organic EL elements arranged in an array is not limited to this and can be changed in various ways.

For example, the case in which the plurality of organic EL elements arranged in an array are not connected by any of the upper electrode layer ELA and the lower electrode layer ELB and are arranged independently is also possible. In this case, each of the organic EL elements is formed of an isolated pattern having a stacked layer structure of the lower electrode layer, the organic layer, and the upper electrode layer, and a plurality of the isolated organic EL elements are arranged in an array. In this case, in each pixel, an active element such as a TFT (Thin Film Transistor) is provided in addition to the organic EL element, and the pixels can be connected through wirings.

The protection film PF is formed over the upper surface of the glass substrate GS (passivation film PAS) so as to cover the organic EL element, that is, the lower electrode layer ELB, the organic layer OEL, and the upper electrode layer ELA. When the organic EL elements are arranged in an array in the display unit DU, the protection film PF is formed so as to cover the organic EL elements arranged in an array. Therefore, the protection film PF is desirably formed over the entire display unit DU. Also, the protection film PF is desirably formed over the almost entire upper surface of the glass substrate GS. By covering the organic EL element with the protection film PF, it is possible to prevent the entrance of moisture into the organic EL element (in particular, entrance of moisture into the organic layer OEL) by the protection film PF.

A resin film PIF is formed over the protection film PF. As a material of the resin film PIF, for example, PET (polyethylene terephthalate) can be used. The formation of the resin film PIF may be omitted. However, the case in which the resin film PIF is formed is more desirable than the case in which the resin film PIF is not formed. Since the resin film PIF is soft, the display unit DU can be easily handled when the resin film PIF is provided. In the manner described above, the display unit DU of the mobile phone MP is configured.

Manufacturing Method of Display Unit

Next, a manufacturing method of the display unit DU will be described with reference to a drawing. FIG. 4 is a flowchart showing a manufacturing process of the display unit DU. First, for example, a glass substrate having translucency to visible light is prepared (S101). Then, the passivation film is formed over the upper surface of the glass substrate (S102). The passivation film can be formed by using, for example, the sputtering method, the CVD (Chemical Vapor Deposition) method, and the ALD (Atomic Layer Deposition) method. The passivation film is made of an insulating material, for example, a silicon oxide film. In particular, a silicon oxide film formed by the CVD method can be used as the passivation film.

Next, the organic EL element made up of the lower electrode layer, the organic layer over the lower electrode layer, and the upper electrode layer over the organic layer is formed over the passivation film. Namely, the lower electrode layer, the organic layer, and the upper electrode layer are formed in this order from below over the passivation film (S103 to S105). For example, this process can be performed as follows.

Namely, the lower electrode layer is formed over the passivation film (S103). For example, the lower electrode layer can be formed by forming a conductive film over the passivation film and patterning the conductive film by the photolithography technology and the etching technology. Thereafter, the organic layer is formed over the lower electrode layer (S104). For example, the organic layer can be formed by the evaporation method (vacuum evaporation method) using a mask. Then, the upper electrode layer is formed over the organic layer (S105). For example, the upper electrode layer can be formed by the evaporation method using a mask.

Subsequently, after the organic EL element made up of the lower electrode layer, the organic layer, and the upper electrode layer is formed, the protection film is formed over the upper electrode (S106). The protection film is formed so as to cover the organic EL element. When a plurality of organic EL elements are arranged in an array, the plurality of organic EL elements are covered with the protection film. The protection film is made of, for example, any of a silicon oxide film, a silicon nitride film, a silicon oxynitride film, an aluminum oxide film, and an aluminum oxynitride film.

Thereafter, the resin film is formed over the protection film (S107). The resin film is made of, for example, PET and can be formed by the spin coating method. In the manner described above, the display unit DU can be manufactured.

Connection Configuration Between Display Unit and Circuit Unit

In order to display an image on the display unit, it is necessary to drive and control the plurality of pixels (organic EL elements) constituting the display unit, and the function of driving and controlling the organic EL elements is implemented by the circuit unit. Therefore, in order to display an image on the display unit, it is necessary to electrically connect the display unit to the circuit unit.

FIG. 5 is a diagram schematically showing a configuration example of electrically connecting the display unit DU and a circuit unit CRU. As shown in FIG. 5, an electrode EL1 electrically connected to the pixels (organic EL elements) constituting the display unit DU is formed in a frame region surrounding the display unit DU, and the electrode EL1 formed in the frame region is electrically connected to the pixels (organic EL elements) constituting the display unit DU. Then, the electrode EL1 is connected to an electrode EL2 formed in a connection tape electrode TE. Further, an electrode EL3 electrically connected to the electrode EL2 is also formed in the connection tape electrode TE together with the electrode EL2, and the electrode EL3 is electrically connected to the circuit unit CRU. Therefore, the display unit DU is electrically connected to the circuit unit CRU through the path of the electrode EL1 formed in the frame region, the electrode EL2 formed in the connection tape electrode TE, and the electrode EL3 formed in the connection tape electrode TE.

Here, by disposing the electrode EL2 formed in the connection tape electrode TE so as to overlap the electrode EL1 formed in the frame region surrounding the display unit DU, the electrode EL1 formed in the frame region is electrically connected to the electrode EL2 constituting the connection tape electrode TE. Accordingly, in order to ensure the electrical connection between the electrode EL1 and the electrode EL2, it is necessary to form the protection film so as not to cover the electrode EL1. This is because when the protection film made of an insulating film is formed so as to cover the electrode EL1, the electrode EL1 cannot be electrically connected to the electrode EL2 of the connection tape electrode TE.

Therefore, it is necessary to form the protection film so as to cover the pixels (organic EL elements) formed in the display unit DU in order to protect the organic EL elements from the entrance of moisture, and further it is necessary to prevent the protection film from being formed in the frame region in which the electrode EL1 is formed in order to ensure the conduction between the electrode EL1 and the electrode EL2 of the connection tape electrode TE.

Necessity of Mask in Formation of Protection Film

As described above, it is necessary to form the protection film so as to cover the pixels (organic EL elements) formed in the display unit DU, and it is also necessary to prevent the protection film from being formed in the frame region in which the electrode EL1 is formed. Here, since one glass substrate GS includes a plurality of regions in which the display unit DU is formed as shown in FIG. 6, if the protection film is formed without using the mask over the entire main surface of the glass substrate GS in which the organic EL elements have been formed, the protection film is formed not only over the display unit DU but also over the frame region surrounding the display unit DU. This means that the protection film is formed so as to cover the electrode EL1 formed in the frame region, so that the conduction between the electrode EL1 and the electrode EL2 of the connection tape electrode TE cannot be ensured. Therefore, the mask is necessary when forming the protection film. Namely, as shown in FIG. 6, the protection film is formed in the state where a mask MK having opening regions OPR corresponding to the display units DU and a cover region CVR corresponding to the frame region is overlapped with the glass substrate GS. In this case, the protection film is formed in the regions (regions in which the display units DU are formed) of the glass substrate GS exposed from the opening regions OPR formed in the mask MK, whereas the protection film is not formed in the region (region to be the frame region) of the glass substrate GS covered with the cover region CVR formed in the mask MK. As described above, when forming the protection film, the mask MK having the opening regions OPR corresponding to the display units DU and the cover region CVR corresponding to the frame region is used. As a result, it is possible to form the protection film so as to cover the pixels (organic EL elements) formed in the display unit DU, and it is also possible to prevent the protection film from being formed in the frame region in which the electrode EL1 is formed.

Reason for Using Atomic Layer Deposition Method (ALD Method) for Formation of Protection Film Next, the protection film that protects the organic EL element from the entrance of moisture is formed by, for example, the atomic layer deposition method (ALD method), and the reason therefor will be described below.

The atomic layer deposition method is a film-forming method in which a film is formed over a substrate in a unit of atomic layer by alternately supplying source gas and reaction gas to the substrate. The atomic layer deposition method forms a film in a unit of atomic layer, and thus has an advantage of excellent step coverage and film thickness controllability. Also, according to the atomic layer deposition method having the advantage of excellent step coverage, in particular, a protection film capable of exerting the function of sufficiently protecting the organic EL element from the entrance of moisture can be formed while reducing the film thickness thereof. Therefore, the atomic layer deposition method is used to form the protection film that protects the organic EL element from the entrance of moisture.

For example, the case where the protection film PF is formed over the glass substrate GS having a foreign particle PCL adhered thereto is considered. Here, as a forming method of the protection film PF, the CVD method may be used. However, as the forming tendency of the protection film by the CVD method, the vertical directionality tends to be strong. Therefore, if the protection film PF is formed by the CVD method over the glass substrate GS to which the foreign particle PCL is adhered as shown in FIG. 7(a), the protection film PF is not formed so as to cover the foreign particle PCL due to the tendency of strong vertical directionality. As a result, a dead space in which no protection film PF is formed is formed around the foreign particle PCL, and the entrance of moisture is likely to occur through the dead space. Namely, even when the protection film PF is intended to be formed by the CVD method so as to cover the glass substrate GS to which the foreign particle PCL is adhered, the dead space in which no protection film PF is formed is formed at the step difference portion between the foreign particle PCL and the glass substrate GS due to the tendency of strong vertical directionality, resulting in the entrance of moisture into the organic EL element through the dead space. Therefore, when the protection film PF is formed by the CVD method, for example, the protection film PF is formed so as to completely cover the foreign particle PCL adhered to the glass substrate GS by increasing the thickness of the protection film formed by the CVD method as shown in FIG. 7(b). In other words, when the protection film PF is formed by the CVD method having the strong vertical directionality, the occurrence of the dead space in which no protection film PF is formed at the step difference portion between the foreign particle PCL and the glass substrate GS is suppressed by increasing the thickness of the protection film PF. Namely, since it is difficult to completely suppress the adhesion of the foreign particle PCL to the glass substrate GS, when the CVD method is used to form the protection film PF, the thickness of the protection film PF must be increased in order to effectively prevent the entrance of moisture into the organic EL element by the protection film PF in consideration of the foreign particle PCL adhered to the glass substrate GS.

On the other hand, the case in which the plasma atomic layer deposition method is used as the forming method of the protection film PF is considered. For example, in the plasma atomic layer deposition apparatus, a film is formed in a unit of atomic layer over the substrate by alternately supplying source gas and reaction gas between a lower electrode that holds the substrate and an upper electrode disposed to face the lower electrode and performing plasma discharge when supplying the source gas. At this time, in the plasma atomic layer deposition apparatus, the film is formed in a unit of atomic layer, and thus, the film excellent in step coverage can be formed. In particular, in the plasma atomic layer deposition apparatus, in order to achieve preferable step coverage, a material that easily diffuses is used as the source gas, and each gas (source gas, purge gas, and reaction gas) is alternately supplied while securing the time for sufficiently diffusing each gas in the film-forming container. Therefore, in the plasma atomic layer deposition apparatus, the source gas and the reaction gas react to form the film even in the minute gap. Namely, since the plasma atomic layer deposition apparatus has the characteristics of (1) the film is formed in a unit of atomic layer, (2) the source gas and the reaction gas spread in every corner of the minute gap, and (3) the source gas and the reaction gas easily react even in the place where the plasma discharge is not generated, the film is formed even in the minute gap.

As a result, in the plasma atomic layer deposition method, the advantage of excellent step coverage can be obtained, and thus, the protection film PF can be formed so as to cover the glass substrate GS to which the foreign particle PCL is adhered even if the thickness of the protection film PF is reduced as shown in FIG. 8. Namely, since the plasma atomic layer deposition method is excellent in step coverage, the occurrence of the dead space in which no protection film PF is formed at the step difference portion between the foreign particle PCL and the glass substrate GS can be prevented, and thus, the entrance of moisture into the organic EL element can be effectively suppressed while reducing the thickness of the protection film PF. In other words, when the protection film PF is formed by the plasma atomic layer deposition method, the protection film PF that can effectively suppress the entrance of moisture into the organic EL element can be formed without increasing the film thickness thereof.

As described above, according to the plasma atomic layer deposition method having the advantage of excellent step coverage, even when the foreign particle PCL is adhered to the glass substrate GS, the protection film PF excellent in the prevention of the entrance of moisture can be formed without increasing the film thickness thereof. Accordingly, it is desirable that the protection film PF that effectively protects the organic EL element from the entrance of moisture is formed by using the plasma atomic layer deposition method.

As described above, since the thickness of the protection film PF can be reduced when the protection film PF is formed by the plasma atomic layer deposition method, it is also effective to apply the protection film PF formed by the plasma atomic layer deposition method to the configuration in which the display unit DU is formed over the flexible substrate or the like.

FIG. 9 is a diagram schematically showing a state in which a flexible substrate 1S is used as the substrate of the display unit DU and this flexible substrate 1S is bent. FIG. 9 shows a bending state of the display unit DU in which the passivation film PAS is formed over the flexible substrate 1S, an organic EL layer OLDL is formed over the passivation film PAS, the protection film PF is formed over the organic EL layer OLDL, and the resin film PIF is formed over the protection film PF. It can be seen that the display unit DU can be bent by forming the display unit DU over the flexible substrate 1S as described above. When the flexible substrate 1S is used as the substrate, there is a risk that cracks may occur in the protection film PF made of an inorganic insulating film when it is bent. Therefore, the protection film PF made of an inorganic insulating film is desirably made as thin as possible.

In this respect, when the flexible substrate 1S is used as the substrate, the thickness of the protection film PF can be reduced by adopting the protection film PF formed by using the plasma atomic layer deposition method. As a result, the protection film PF formed by the plasma atomic layer deposition method is useful in that it is possible to efficiently obtain the effect of preventing the entrance of moisture by the protection film PF while suppressing the occurrence of cracks in the protection film PF made of an inorganic insulating film.

Film-Forming Method of Protection Film by Plasma Atomic Layer Deposition Method

As described above, in order to effectively protect the organic EL element from the entrance of moisture while reducing the thickness of the protection film PF, it is useful to form the protection film by the plasma atomic layer deposition method. Thus, the forming method of the protection film by the plasma atomic layer deposition method will be described below. FIG. 10 is a flowchart for describing the forming method of the protection film by the plasma atomic layer deposition method.

First, the glass substrate is prepared, and the glass substrate is loaded over the lower electrode (stage) of the plasma atomic layer deposition apparatus. Subsequently, source gas is introduced into the film-forming container (process chamber) from a gas supply unit of the plasma atomic layer deposition apparatus (S201). At this time, the source gas is supplied into the film-forming container for, for example, 0.1 second. Consequently, the source gas is supplied into the film-forming container, and the source gas is adsorbed to the glass substrate and an adsorption layer is formed.

Subsequently, the supply of the source gas is stopped, and purge gas is introduced into the film-forming container (process chamber) from the gas supply unit (S202). Consequently, the purge gas is supplied into the film-forming container, and the source gas is exhausted to the outside of the film-forming container from an exhaust unit. The purge gas is supplied into the film-forming container for, for example, 0.1 second. Then, the exhaust unit exhausts the source gas and the purge gas in the film-forming container for, for example, 2 seconds. Consequently, the purge gas is supplied into the film-forming container and the source gas which is not adsorbed to the glass substrate is purged from the film-forming container.

Next, reaction gas is supplied from the gas supply unit (S203). Consequently, the reaction gas is supplied into the film-forming container. The reaction gas is supplied into the film-forming container for, for example, 1 second. In the step of supplying the reaction gas, plasma discharge is generated by applying a discharge voltage between the upper electrode and the lower electrode (S204). As a result, radicals (active species) are generated in the reaction gas. In the manner described above, the reaction gas is supplied into the film-forming container and the adsorption layer adsorbed to the glass substrate chemically reacts with the reaction gas, so that the protection film made of an atomic layer is formed.

Subsequently, the supply of the reaction gas is stopped, and purge gas is supplied from the gas supply unit (S205). Consequently, the purge gas is supplied into the film-forming container, and the reaction gas is exhausted to the outside of the film-forming container from the exhaust unit. The purge gas is supplied into the film-forming container for, for example, 0.1 second. Then, the exhaust unit exhausts the reaction gas and the purge gas in the film-forming container for, for example, 2 seconds. Consequently, the purge gas is supplied into the film-forming container, and the excessive reaction gas which is not used for the reaction is purged from the film-forming container.

In the manner described above, the protection film made of one atomic layer is formed over the glass substrate. Thereafter, by repeating the above-described steps (S201 to S205) a predetermined number of times (S206), the protection film made of a plurality of atomic layers is formed. Consequently, the film-forming process is completed (S207). In the manner described above, the protection film PF can be formed by the plasma atomic layer deposition method.

Study for Improvement

As described above, the protection film that protects the organic EL element from the entrance of moisture can be formed by the plasma atomic layer deposition method using the mask having the opening regions corresponding to the display units and the cover region corresponding to the frame region.

At this time, the study by the inventors of the present invention has newly revealed that there is a room for improvement in the process of forming the protection film by the plasma atomic layer deposition method using the mask having the opening regions corresponding to the display units and the cover region corresponding to the frame region.

First, as described in the paragraph of "<Necessity of Mask in Formation of Protection Film>", the mask MK is necessary when forming the protection film, and the mask MK has substantially the same size as the glass substrate GS. This is because the protection film needs to be formed at a time over all of the regions of the glass substrate GS corresponding to the plurality of display units DU, and all of the region to be the frame region (region other than the plurality of display units DU) needs to be covered so as not to form the protection film in all of the frame region when forming the protection film.

Incidentally, in recent years, from the viewpoint of improving the manufacturing efficiency, the size of the glass substrate GS has been increasing in order to increase the number of display units DU acquired from one glass substrate GS. This means that the size of the mask MK having substantially the same size as the glass substrate GS is also increased. Also, the increase in size of the mask MK leads to the situation in which it is difficult to ensure the flatness of the mask MK. This is because the weight of the mask MK itself increases due to the increase in size of the mask MK and the deflection is thus likely to occur in the mask MK, making it difficult to ensure the flatness of the mask MK.

Further, since it becomes difficult to ensure the flatness of the mask MK due to the increase in size of the mask MK, the minute gap is present between the mask MK and the glass substrate GS. At this time, in the related technology, since (1) the minute gap is present between the mask MK and the glass substrate GS and (2) the forming method of the protection film is the plasma atomic layer deposition method, the protection film is formed also in a part of the frame region of the glass substrate GS. For example, FIG. 11 is a diagram schematically showing a state in which the protection film is formed so as to enter the minute gap between the glass substrate GS and the mask MK. In this case, the electrode electrically connected to the display unit is formed in the frame region present below the mask MK, and when the protection film made of an insulating material is formed over the electrode, the conduction between the display unit and the circuit unit through the electrode cannot be ensured.

Namely, in the plasma atomic layer deposition method used to form the protection film, in order to achieve preferable step coverage, a material that easily diffuses is used as the source gas, and each gas (source gas, purge gas, and reaction gas) is alternately supplied while securing the time for sufficiently diffusing each gas in the film-forming container. Therefore, for example, the source gas and the reaction gas spread not only to the substrate but also in every corner of the film-forming container. Also, in the plasma atomic layer deposition apparatus, the film is formed by generating active species (radicals) by the plasma discharge in the reaction gas and reacting the active species with the source gas adsorbed to the substrate, and in addition, the source gas and the reaction gas tend to react with each other even in a state where the active species (radicals) are not generated by plasma discharge. Therefore, in the plasma atomic layer deposition apparatus, the source gas and the reaction gas react with each other to form the film even in the minute gap in which the plasma discharge is not generated. In other words, since the atomic layer deposition apparatus has the characteristics of (1) the film is formed in a unit of atomic layer, (2) the source gas and the reaction gas spread in every corner of the film-forming container, and (3) the source gas and the reaction gas easily react even in the place where the plasma discharge is not generated, the film is formed even in the minute gap formed between the mask MK and the glass substrate GS.

FIG. 12 is a graph showing a relationship between a distance of entrance from a mask edge toward the mask and a thickness of the formed protection film. In FIG. 12, the horizontal axis represents the distance (mm) of entrance from the mask edge toward the mask, and the vertical axis represents the thickness (nm) of the formed protection film. As can be seen from FIG. 12, the protection film is formed even at the position entered from the mask edge toward the mask. Namely, according to the measurement results shown in FIG. 11, it can be seen that the protection film is formed also in apart of the frame region of the glass substrate GS that is supposed to be covered with the mask in the related technology. Incidentally, in the mobile phone (smartphone), it is desired that the size of the display unit is increased and the size of the frame region is reduced as much as possible. This is because it is desired that the overall size of the mobile phone is reduced while ensuring the size of the display unit in the mobile phone (smartphone). In this respect, when the size of the frame region is reduced in the related technology, there is a high possibility that the protection film is formed so as to cover the electrode formed in the frame region due to the entrance of the protection film. In this case, there is a concern that the conduction between the display unit and the circuit unit through the electrode cannot be ensured. On the other hand, when the frame region is configured to have a larger size to form the electrode in an inner region where the entrance of the protection film does not occur, the size of the frame region is increased, so that the overall size of the mobile phone is increased even though the size of the display unit is not increased. Accordingly, it can be seen that there is a room for improvement from the viewpoint of ensuring the electrical connection reliability between the display unit and the circuit unit through the electrode formed in the frame region while reducing the size of the frame region in the related technology.

Here, since the main cause of the entrance of the protection film into the frame region is the formation of the minute gap between the glass substrate and the mask, the elimination of the minute gap is considered. In particular, since the minute gap is caused by the decrease in the flatness of the mask, it is conceivable to eliminate the gap by the selection of the mask material constituting the mask. For example, when the mask material is made of metal, the distance of entrance of the protection film is about 3 mm. On the other hand, when the mask material is made of ceramic, the distance of entrance of the protection film is about 1 mm. Accordingly, it seems that the entrance of the protection film into the frame region can be suppressed by changing the mask material from metal to ceramic. However, even when the mask material is changed to ceramic, the decrease in the flatness of the mask cannot be completely solved, and in particular, there is a concern that the entrance of the protection film into the frame region expands due to the increase in size of the mask even when the mask is made of ceramic. As described above, changing the mask material in order to suppress the entrance of the protection film into the frame region is not an essential measure, and a further fundamental measure is needed.

Namely, in order to suppress the formation of the minute gap between the mask MK and the glass substrate GS, it is essentially important to ensure the flatness of the mask MK. In this respect, it is conceivable to suppress the deflection of the mask MK by increasing the rigidity of the mask MK and to increase the thickness of the mask MK in order improve the flatness of the mask MK.

However, in the case of the mask MK with high rigidity, the minute gap is formed between the mask MK and the glass substrate GS as shown in FIG. 13 if the completely flat mask MK cannot be manufactured. In other words, in the case of the mask MK with high rigidity, the minute gap is formed between the mask MK and the glass substrate GS due to the high rigidity on the contrary if the complete flatness cannot be realized. Further, when taking into account the fact that it is difficult to form the mask MK having the complete flatness, it is considered difficult to ensure the flatness of the mask MK in practice in the method of manufacturing the mask MK with high rigidity by increasing the thickness of the mask MK.

On the other hand, when the thickness of the mask MK is reduced, the rigidity of the mask MK is decreased. Therefore, for example, when the mask MK having small thickness is disposed over the glass substrate GS as shown in FIG. 14, the mask MK can be disposed over the glass substrate GS having unevenness so as to follow the unevenness of the glass substrate GS. Namely, since the rigidity of the mask MK having small thickness is low, the mask MK fits the glass substrate GS having unevenness, and the adhesion between the mask MK and the glass substrate GS can be improved. Accordingly, from the viewpoint of suppressing the formation of the minute gap between the mask MK and the glass substrate GS by improving the adhesion between the mask MK and the glass substrate GS, the mask MK with low rigidity is more desirable than the mask MK with high rigidity. However, for example, as shown in FIG. 15, there is an inconvenience that it is difficult to hold the thin mask MK by pins due to the low rigidity. Namely, the thin mask MK is useful from the viewpoint of improving the adhesion between the mask MK and the glass substrate GS, but a contrivance is required from the viewpoint of holding the thin mask MK.

In this respect, first, in order to securely hold the thin mask MK, a method of fixing both ends of the mask MK by holding members 100 while applying a tension to the thin mask MK as shown in FIG. 16(a) is conceivable. However, when this method is adopted, if the glass substrate GS has the unevenness (undulation) as shown in FIG. 16(b), the thin mask MK does not fit the unevenness of the glass substrate GS due to the tension applied to the thin mask MK, and the minute gap is formed between the glass substrate GS having the unevenness and the thin mask MK. Namely, the method of fixing the both ends of the mask MK by the holding members 100 while applying a tension to the thin mask MK is useful from the viewpoint of holding the mask, but this results in the loss of the advantage of the thin mask MK of being able to follow the unevenness of the glass substrate GS. Therefore, in the method of fixing the both ends of the mask MK by the holding members 100 while applying a tension to the thin mask MK, it is difficult to securely hold the thin mask MK while maintaining the advantage of the thin mask MK of being able to fit the unevenness of the glass substrate GS. Namely, a contrivance is required in order to achieve both of the improvement in the adhesion between the mask MK and the glass substrate GS and the secure holding of the mask MK.

Thus, in this embodiment, a contrivance to achieve both of the improvement in the adhesion between the mask MK and the glass substrate GS and the secure holding of the mask MK is applied. Hereinafter, the technological idea according to this embodiment to which this contrivance is applied will be described.

Planar Configuration of Mask Holder

In this embodiment, a mask holder configured to hold a mask is used. In the following, a planar configuration of the mask holder according to this embodiment will be described, and then, a cross-sectional configuration of the mask holder according to this embodiment will be described.

FIG. 17 is a plan view showing a planar configuration of a mask holder MSP according to this embodiment. As shown in FIG. 17, the mask holder MSP according to this embodiment has a substantially rectangular planar shape, and a plurality of openings OPU are formed in the mask holder MSP. This mask holder MSP is configured to be disposed over the mask MK shown in FIG. 6, and is particularly configured such that openings OPU of the mask holder MSP are located at positions above opening regions OPR of the mask MK shown in FIG. 6.

Cross-Sectional Configuration of Mask Holder

FIG. 18 is a cross-sectional view schematically showing the cross-sectional configuration of the mask holder MSP taken along a line A-A of FIG. 17. As shown in FIG. 18, the mask holder MSP according to this embodiment is configured to be able to hold the mask MK and includes a suspension portion HU capable of suspending the mask MK and moving vertically and a supporting portion SU capable of supporting the suspension portion HU and separable from the suspension portion HU.

Specifically, the supporting portion SU has a front surface (upper surface) and aback surface (lower surface) on a side opposite to the front surface, and a groove DIT1 formed in the front surface, a groove DIT2 communicating with the groove DIT1 and having a width smaller than that of the groove DIT1, and a groove DIT3 formed in a back surface, communicating with the groove DIT2 and having a width smaller than that of the groove DIT2 are formed in this supporting portion SU as shown in FIG. 18. Also, the suspension portion HU is disposed in the groove DIT2 and is configured to be able to move vertically and come into and out of contact with a bottom surface of the groove DIT2. In addition, the back surface of the supporting portion SU is configured to be able to come into and out of contact with the mask MK. Further, as shown in FIG. 18, a cap CP to fill the groove DIT1 is provided in the supporting portion SU. Also, the suspension portion HU is configured to be able to move in a thickness direction (vertical direction) of the supporting portion SU, and is configured such that an interval is present between an upper surface of the suspension portion HU and a lower surface of the cap CP when the mask MK suspended by the suspension portion HU is in contact with the back surface of the supporting portion SU.

For example, as shown in FIG. 18, the mask MK is welded with a plurality of shafts, and threading is formed at a tip end portion of each shaft. Also, the tip end portion of each of the plurality of shafts is inserted into a screw hole formed in each of a plurality of suspension portions HU, so that each of the plurality of shafts and each of the plurality of suspension portions HU are connected with each other. As a result, the mask MK is suspended by the suspension portions HU via the shafts. As described above, the suspension portion HU is configured to be able to suspend the mask MK. Also, the cap CP is embedded in the groove DIT1 communicating with the groove DIT2 in which the suspension portion HU is disposed, and the cap CP is fixed to the supporting portion SU by a screw or the like. At this time, an interval is present between the suspension portion HU and the cap CP, and the interval is formed to have a size in which the suspension portion HU does not come into contact with the cap CP even when it moves vertically. In other words, the mask holder MSP according to this embodiment is configured such that the interval is present between the suspension portion HU and the cap CP even when the mask MK suspended by the suspension portion HU comes into contact with the supporting portion SU by moving the suspension portion HU vertically.

Here, as shown in FIG. 18, a thickness of the supporting portion SU is much larger than that of the suspension portion HU, and a mass of the supporting portion SU is larger than that of the suspension portion HU. Also, the mask MK is formed thinly so as to have a low rigidity, and a thickness of the mask MK is, for example, smaller than 1 mm.

Operation of Disposing Mask Over Substrate by Mask Holder

The mask holder MSP according to this embodiment is configured as described above, and an operation of disposing the mask MK over the substrate by using the mask holder MSP according to this embodiment will be described with reference to drawings.

Specifically, an example in which the mask holder MSP according to this embodiment is used for a process of disposing the mask MK over the glass substrate loaded over a substrate loading unit in a method of performing a film-forming process to the substrate by using a plasma atomic layer deposition apparatus having the substrate loading unit will be described.

In particular, an operation of disposing the mask MK over the glass substrate by the mask holder MSP in a manufacturing method of an electronic device having a display unit on which an image is displayed will be described. In detail, an operation of disposing the mask MK over the glass substrate by the mask holder MSP in the film-forming method including the step of disposing the substrate over the substrate loading unit, the step of disposing the mask MK over the glass substrate by the mask holder MSP, the step of supplying source gas above the glass substrate, the step of supplying reaction gas above the glass substrate, and the step of generating plasma above the glass substrate will be described.

First, as shown in FIG. 19, the mask holder MSP is supported by pins PN so as to be located above the glass substrate GS disposed over a stage (substrate loading unit) ST. At this time, the mask holder MSP includes the suspension portion HU that suspends the mask MK and the supporting portion SU that supports the suspension portion HU, and the mask MK is suspended by the suspension portion HU disposed in the supporting portion SU. Namely, by bringing the suspension portion HU into contact with the bottom surface of the groove DIT2 formed in the supporting portion SU, the mask MK is suspended by the suspension portion HU in the state of supporting the suspension portion HU by the supporting portion SU. In this state, the mask MK is separated from the back surface of the supporting portion SU, and a tensile force from the suspension portion HU is applied to the mask MK. The thickness of the mask MK is smaller than that of the glass substrate GS. Note that an alignment mark AM1 is formed in the glass substrate GS and an alignment mark AM2 is formed in the mask MK.

Next, as shown in FIG. 20, the stage ST over which the glass substrate GS is loaded is moved upward. Consequently, the distance between the glass substrate GS and the mask MK suspended by the mask holder MSP is reduced. The glass substrate GS and the mask MK are aligned with each other in the state where the distance between the glass substrate GS and the mask MK suspended by the mask holder MSP is reduced in this manner. Specifically, the stage ST over which the glass substrate GS is loaded is moved in a horizontal direction (lateral direction) so that the alignment mark AM1 formed in the glass substrate GS and the alignment mark AM2 formed in the mask MK are aligned in a plane.

Note that it is also possible to reduce the distance between the glass substrate GS and the mask MK suspended by the mask holder MSP by moving the pins PN that support the mask holder MSP downward instead of moving the stage ST over which the glass substrate GS is loaded upward.

Then, when the alignment between the glass substrate GS and the mask MK ends, the stage ST is further moved upward and the glass substrate GS and the mask MK are brought into contact with each other as shown in FIG. 21. Namely, after the glass substrate GS and the mask MK are aligned with each other, the mask MK suspended by the suspension portion HU is brought into contact with the glass substrate GS in the state of supporting the suspension portion HU by the supporting portion SU. At this time, since the mask MK is supported by the glass substrate GS, the tensile force from the suspension portion HU ceases to be applied to the mask MK. Here, since the thickness of the mask MK having a large area is smaller than 1 mm and has low rigidity, the mask MK is deformed so as to follow the unevenness of the surface of the glass substrate GS. In other words, since the rigidity of the mask MK is low, the mask MK is disposed so as to fit the surface of the glass substrate GS.

Note that it is also possible to bring the glass substrate GS and the mask MK into contact with each other by moving the pins PN that support the mask holder MSP downward instead of bringing the glass substrate GS and the mask MK into contact with each other by moving the stage ST upward.

Subsequently, as shown in FIG. 22, the stage ST over which the glass substrate GS is loaded is moved upward. Consequently, the suspension portion HU is separated from the supporting portion SU while maintaining the state in which the mask MK is in contact with the glass substrate GS. As a result, since the gravity force based on the mass of the suspension portion HU (including shaft) is applied to the mask MK, the pressing force from the suspension portion HU is applied to the mask MK. Therefore, the adhesion between the glass substrate GS and the mask MK is further improved by this pressing force.

Note that it is also possible to separate the suspension portion HU from the supporting portion SU while maintaining the state in which the mask MK is in contact with the glass substrate GS by moving the pins PN that support the mask holder MSP downward instead of moving the stage ST over which the glass substrate GS is loaded upward.

Next, as shown in FIG. 23, the mask MK is brought into contact with the back surface of the mask holder MSP by further moving the stage ST upward. Note that it is also possible to bring the mask MK into contact with the back surface of the mask holder MSP by moving the pins PN that support the mask holder MSP downward instead of moving the stage ST upward.

Thereafter, as shown in FIG. 24, the pins PN that support the mask holder MSP are moved downward. Consequently, the supporting portion SU is brought into contact with the mask MK while maintaining the state in which the suspension portion HU is separated from the supporting portion SU. As a result, the gravity force based on the mass of the supporting portion SU is applied to the mask MK. Namely, in this state, the pressing force is applied from the suspension portion HU to the mask MK and the pressing force from the supporting portion SU is further applied to the mask MK. Therefore, the adhesion between the glass substrate GS and the mask MK is further improved by the combined force of the pressing force from the suspension portion HU and the pressing force from the supporting portion SU. In particular, since the mass of the supporting portion SU is much larger than that of the suspension portion HU, the effect of improving the adhesion between the glass substrate GS and the mask MK is increased by the addition of the pressing force from the supporting portion SU.

In the manner described above, the operation of disposing the mask MK over the glass substrate GS by using the mask holder MSP is completed. Thereafter, the film-forming process to the glass substrate GS is performed by the plasma atomic layer deposition apparatus while maintaining the state in which the mask MK is disposed over the glass substrate GS and the mask holder MSP is disposed over the mask MK.

Characteristic Points in this Embodiment

Subsequently, characteristic points in this embodiment will be described. The first characteristic point in this embodiment is that the mask MK suspended by the suspension portion HU is brought into contact with the glass substrate GS while suspending the mask MK by the suspension portion HU in the state in which the suspension portion HU of the mask holder MSP is supported by the supporting portion SU of the mask holder MSP as shown in FIG. 19. Consequently, according to this embodiment, even though the thin mask MK with low rigidity having an advantage of being able to follow the unevenness of the glass substrate GS and improve the adhesion with the glass substrate GS is used, the thin mask MK with low rigidity that is difficult to be supported by pins can be securely supported by the configuration in which the mask MK is suspended by the suspension portion HU. Namely, according to this embodiment, it is possible to achieve both of the improvement in adhesion between the glass substrate GS and the mask MK and the improvement in easiness of holding the mask MK by supporting the thin mask MK with low rigidity by using the mask holder MSP including the suspension portion HU that suspends the mask MK and the supporting portion SU that supports the suspension portion HU. As a result, according to this embodiment, the adhesion between the glass substrate GS and the mask MK can be improved, and the formation of the minute gap between the glass substrate GS and the mask MK can be suppressed. Consequently, according to this embodiment, even when the plasma atomic layer deposition method in which the film is likely to be formed even in the minute gap is used, it is possible to suppress the formation of the film in the region of the glass substrate GS covered with the mask MK. Therefore, according to this embodiment, when the protection film is formed over the glass substrate GS by using the mask MK having the opening regions OPR corresponding to the display units DU and the cover region CVR corresponding to the frame region shown in FIG. 6, it is possible to form the protection film so as to cover the pixel (organic EL element) formed in the display unit DU and to prevent the protection film from being formed in the frame region in which the electrode is formed. As a result, according to this embodiment, it is possible to improve the connection reliability between the electrode EL1 electrically connected to the display unit DU and the electrode EL2 formed in the connection tape electrode TE shown in FIG. 5. This means that the reliability of the electronic device including the display unit DU can be improved from the viewpoint focused on the electronic device as a final product and the manufacturing yield of the electronic device including the display unit DU can be improved from the viewpoint focused on the manufacturing process of the electronic device. Therefore, according to the first characteristic point in this embodiment, it is possible to realize the highly reliable electronic device while reducing the manufacturing cost of the electronic device.

Next, the second characteristic point in this embodiment is that the supporting portion SU of the mask holder MSP is finally brought into contact with the mask MK as shown in FIG. 24. Consequently, the pressing force to press the mask MK to the glass substrate GS can be applied to the mask MK from the supporting portion SU of the mask holder MSP. This means that the adhesion between the mask MK with low rigidity and the glass substrate can be further improved, so that the formation of the minute gap between the mask MK and the glass substrate GS can be further reduced. In particular, since the mass of the supporting portion SU is larger than that of the suspension portion HU, the pressing force applied to the mask MK can be increased, so that it is possible to effectively suppress the formation of the minute gap between the glass substrate GS and the mask MK.

In addition, from the viewpoint of effectively suppressing the formation of the minute gap between the glass substrate GS and the mask MK, it is also effective to form the mask MK from a magnetic substance. This is because the pressing force of the mask MK to the glass substrate GS can be further increased by embedding an electromagnet in the stage ST and attracting the mask MK made of a magnetic substance to the electromagnet. Further, it is also desirable to make the supporting portion SU of the mask holder MSP from a magnetic substance in addition to the mask MK. This is because the magnetic force from the electromagnet acts also on the mask holder MSP, so that not only the pressing force based on the mass of the mask holder MSP but also the pressing force based on the magnetic force is applied to the mask MK from the mask holder MSP in this case.

In the foregoing, the invention made by the inventors of the present invention has been concretely described based on the embodiments. However, it is needless to say that the present invention is not limited to the foregoing embodiments and various modifications can be made within the scope of the present invention.

REFERENCE SIGNS LIST

CP: cap
DIT1: groove
DIT2: groove
DIT3: groove
DU: display unit
GS: glass substrate
HU: suspension portion
MK: mask
MSP: mask holder
PF: protection film
ST: stage
SU: supporting portion

The invention claimed is:

1. A mask holder capable of holding a mask, comprising:
a suspension portion capable of suspending the mask and moving vertically; and
a supporting portion capable of supporting the suspension portion and separating from the suspension portion,
wherein the supporting portion includes:
a front surface; and
a back surface on a side opposite to the front surface,
a first groove formed in the front surface, a second groove communicating with the first groove and having a width smaller than that of the first groove, and a third groove formed in the back surface, communicating with the second groove and having a width smaller than that of the second groove are formed in the supporting portion,
the suspension portion is disposed in the second groove and is configured to be able to come into and out of contact with a bottom surface of the second groove, and
the back surface of the supporting portion is configured to be able to come into and out of contact with the mask.

2. The mask holder according to claim 1,
wherein a cap to fill the first groove is provided in the supporting portion,
the suspension portion is configured to be able to move in a thickness direction of the supporting portion, and
when the mask suspended by the suspension portion is in contact with the back surface of the supporting portion, an interval is present between an upper surface of the suspension portion and a lower surface of the cap.

3. The mask holder according to claim 1,
wherein the mask is made of a magnetic substance.

* * * * *